(12) United States Patent
Gu et al.

(10) Patent No.: US 9,368,450 B1
(45) Date of Patent: Jun. 14, 2016

(54) INTEGRATED DEVICE PACKAGE COMPRISING BRIDGE IN LITHO-ETCHABLE LAYER

(71) Applicant: QUALCOMM Incorporated, San Diego, CA (US)

(72) Inventors: Shiqun Gu, San Diego, CA (US); Hong Bok We, San Diego, CA (US); Jae Sik Lee, San Diego, CA (US); Dong Wook Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/832,363

(22) Filed: Aug. 21, 2015

(51) Int. Cl.
*H01L 23/48* (2006.01)
*H01L 23/52* (2006.01)
*H01L 29/40* (2006.01)
*H01L 23/538* (2006.01)

(52) U.S. Cl.
CPC ........ *H01L 23/5381* (2013.01); *H01L 23/5384* (2013.01); *H01L 23/5386* (2013.01)

(58) Field of Classification Search
CPC ............ H01L 23/5381; H01L 21/5384; H01L 21/5386
USPC ......................................................... 257/776
See application file for complete search history.

(56) References Cited

U.S. PATENT DOCUMENTS

| 7,402,901 | B2 | 7/2008 | Hatano et al. | |
|---|---|---|---|---|
| 7,969,009 | B2 | 6/2011 | Chandrasekaran | |
| 8,039,939 | B2 | 10/2011 | Hwang | |
| 2010/0327424 | A1* | 12/2010 | Braunisch | H01L 23/5385 257/692 |
| 2012/0104562 | A1 | 5/2012 | Pagaila et al. | |
| 2014/0321091 | A1 | 10/2014 | Zhang et al. | |
| 2015/0028486 | A1* | 1/2015 | Liu | H01L 23/48 257/773 |
| 2016/0079196 | A1* | 3/2016 | Teh | H01L 24/25 257/774 |

* cited by examiner

*Primary Examiner* — David S Blum
(74) *Attorney, Agent, or Firm* — Loza & Loza, LLP

(57) ABSTRACT

An integrated device package includes a first die, a second die, an encapsulation portion coupled to the first die and the second die, and a redistribution portion coupled to the encapsulation portion. The encapsulation portion includes an encapsulation layer, a bridge, and a first via. The bridge is at least partially embedded in the encapsulation layer. The bridge is configured to provide a first electrical path for a first signal between the first die and the second die. The first via is in the encapsulation layer. The first via is coupled to the bridge. The first via and the bridge are configured to provide a second electrical path for a second signal to the first die. The redistribution portion includes at least one dielectric layer, and at least one interconnect, in the dielectric layer, coupled to the first via.

30 Claims, 17 Drawing Sheets

PROFILE VIEW

PLAN VIEW

INTEGRATED DEVICE PACKAGE COMPRISING BRIDGE IN LITHO-ETCHABLE LAYER

BACKGROUND

1. Field

Various features relate to an integrated device package that includes a bridge in a litho-etchable layer.

2. Background

FIG. 1 illustrates an integrated device package 100 that includes a first die 102, a second die 104, and a package substrate 106. The package substrate 106 includes a dielectric layer and a plurality of interconnects 110. The package substrate 106 is a laminated substrate. The plurality of interconnects 110 includes traces, pads and/or vias. The first die 102 is coupled to the package substrate 106 through the first set of solder balls 112. The second die 104 is coupled to the package substrate 106 through the second set of solder balls 114. The package substrate 106 is coupled to a printed circuit board (PCB) 108 through the third set of solder balls 116. FIG. 1 illustrates that the first die 102 is coupled to the second die 104 through the first set of solder balls 112, interconnects from the plurality of interconnects 110, and the second set of solder balls 114.

One drawback of the integrated device package 100 shown in FIG. 1 is that it creates an integrated device package with a form factor that may be too large for the needs of mobile computing devices and/or wearable computing devices. This may result in a package that is either too large and/or too thick. That is, the integrated device package configuration shown in FIG. 1 may be too thick and/or have a surface area that is too large to meet the needs and/or requirements of mobile computing devices and/or wearable computing devices.

Another drawback of the integrated device package 100 is that the configuration of the plurality of interconnects 110 does not provide high density interconnects between the first die 102 and the second die 104. This greatly limits the number of interconnects that can exist between the first die 102 and the second die 104, therefore limiting the communication bandwidth between the first die 102 and the second die 104.

Therefore, there is a need for an integrated device package that includes high density interconnects between dies. Ideally, such an integrated device package will have a better form factor, provide an improved power distribution network (e.g., improved power routing to and from dies), while at the same time meeting the needs and/or requirements of mobile computing devices and/or wearable computing devices.

SUMMARY

Various features relate to an integrated device package that includes a bridge in a litho-etchable layer.

A first example provides an integrated device package base that includes an encapsulation portion and a redistribution portion coupled to the encapsulation portion. The encapsulation portion includes an encapsulation layer, a bridge at least partially embedded in the encapsulation layer, and a first via in the encapsulation layer. The bridge is configured to provide a first electrical path for a first signal between a first die and a second die. The first via is coupled to the bridge. The first via and the bridge are configured to provide a second electrical path for a second signal to the first die. The redistribution portion includes at least one dielectric layer and at least one interconnect, in the at least one dielectric layer, coupled to the first via.

A second example provides an integrated device package base that includes an encapsulation portion and a redistribution portion coupled to the encapsulation portion. The encapsulation portion includes an encapsulation layer, means, at least partially embedded in the encapsulation layer, for providing a first electrical path for a first signal between a first die and a second die, and a first via in the encapsulation layer. The first via is coupled to the means for providing the first electrical path for the first signal between the first die and the second die. The first via and the means for providing the first electrical path for the first signal between the first die and the second die, are configured to provide a second electrical path for a second signal to the first die. The redistribution portion includes at least one dielectric layer, and at least one interconnect, in the at least one dielectric layer, coupled to the first via.

A third example provides an integrated device package that includes a first die, a second die, and a base coupled to the first die and the second die. The base includes an encapsulation portion coupled to the first die and the second die, and a redistribution portion coupled to the encapsulation portion. The encapsulation portion includes an encapsulation layer, a bridge at least partially embedded in the encapsulation layer, and a first via in the encapsulation layer. The bridge is configured to provide a first electrical path for a first signal between the first die and the second die. The first via is coupled to the bridge. The first via and the bridge are configured to provide a second electrical path for a second signal to the first die. The redistribution portion includes at least one dielectric layer, and at least one interconnect, in the at least one dielectric layer, coupled to the first via.

A fourth example provides an integrated device package that includes a first die, a second die, and a base coupled to the first die and the second die. The base includes an encapsulation portion coupled to the first die and the second die, and a redistribution portion coupled to the encapsulation portion. The encapsulation portion includes an encapsulation layer, means, at least partially embedded in the encapsulation layer, for providing a first electrical path for a first signal between the first die and the second die, and a first via in the encapsulation layer. The first via is coupled to the means for providing the first electrical path for the first signal between the first die and the second die. The first via and the means for providing the first electrical path for the first signal between the first die and the second die, are configured to provide a second electrical path for a second signal to the first die. The redistribution portion includes at least one dielectric layer, and at least one interconnect, in the at least one dielectric layer, coupled to the first via.

DRAWINGS

Various features, nature and advantages may become apparent from the detailed description set forth below when taken in conjunction with the drawings in which like reference characters identify correspondingly throughout.

DETAILED DESCRIPTION

Figure 1:
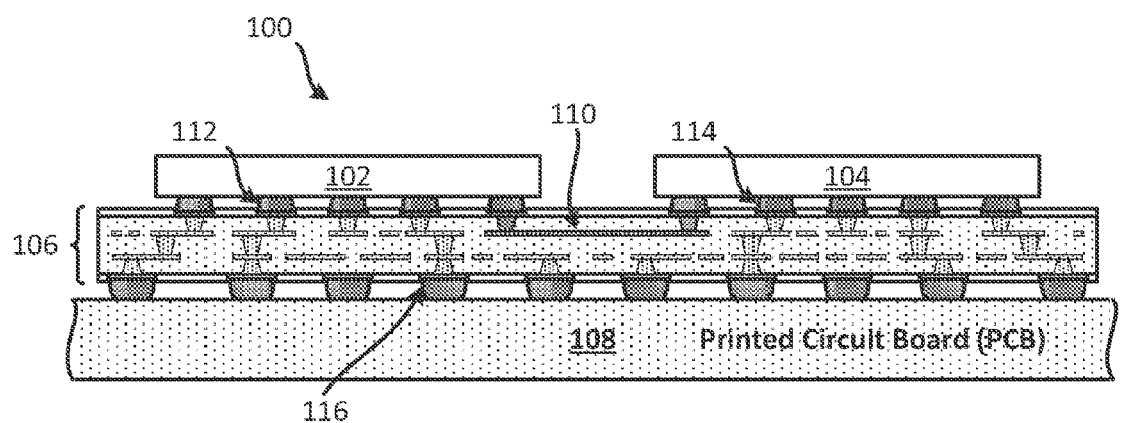
FIG. 1 illustrates an integrated device package comprising two dies.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some features pertain an integrated device package that includes a first die, a second die, and a base (e.g., integrated device package base) coupled to the first die and the second die. The base includes an encapsulation portion and a redistribution portion coupled to the encapsulation portion. The encapsulation portion is coupled to the first die and the second die. The encapsulation portion includes an encapsulation layer, a bridge, and a first via. The encapsulation layer may be a litho-etchable material (e.g., material etchable by photolithography process). The bridge is at least partially embedded in the encapsulation layer. The bridge is configured to provide a first electrical path for a first signal (e.g., input/output signal) between the first die and the second die. The first via is in the encapsulation layer. The first via is coupled to the bridge. The first via and the bridge are configured to provide a second electrical path for a second signal (e.g., power signal, ground reference signal) to the first die. In some implementations, the first via has a profile cross section comprising a V shape or a U shape. The redistribution portion includes at least one dielectric layer, and at least one interconnect in the at least one dielectric layer. The at least one interconnect is coupled to the first via. In some implementations, the bridge includes a substrate, a dielectric layer, a first set of interconnects configured to provide the first electrical path for the first signal between the first die and the second die. The bridge also includes a through substrate via (TSV) traversing at least the substrate. The TSV is coupled to the first via. The TSV is configured to provide the second electrical path for the second signal to the first die. In some implementations, the TSV traverses the substrate and the dielectric layer of the bridge.

An interconnect is an element or component of a device (e.g., integrated device, integrated device package, die) and/or a base (e.g., integrated device package base, package substrate, printed circuit board, interposer) that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that provides an electrical path for a signal (e.g., data signal, ground signal, power signal). An interconnect may include more than one element/component. A set of interconnects may include one or more interconnects.

A redistribution layer or a redistribution metal layer is a metal layer of a redistribution portion of an integrated device, an integrated device package, and/or integrated device package base. A redistribution layer may include one or more redistribution interconnects, which are formed on the same metal layer of the redistribution portion. A redistribution portion of an integrated device or integrated device package may include several redistribution layers, each redistribution layer may include one or more redistribution interconnects. Thus, for example, a redistribution portion may include a first redistribution interconnect on a first redistribution layer, and a second redistribution interconnect on a second redistribution layer that is different than the first redistribution layer.

A litho-patternable layer/material (e.g., litho-etchable layer) is a material that is photo patternable and developable (e.g., photo etchable). That is, the litho-patternable layer/material is made of a material that can be patterned, developed, etched and/or removed (e.g., through a lithography process) through the exposure of the material to a light source (e.g., ultraviolet (UV) light) through a mask (e.g., photomask).

Exemplary Integrated Device Package Comprising Bridge in Litho-Etchable Layer

Figure 2:
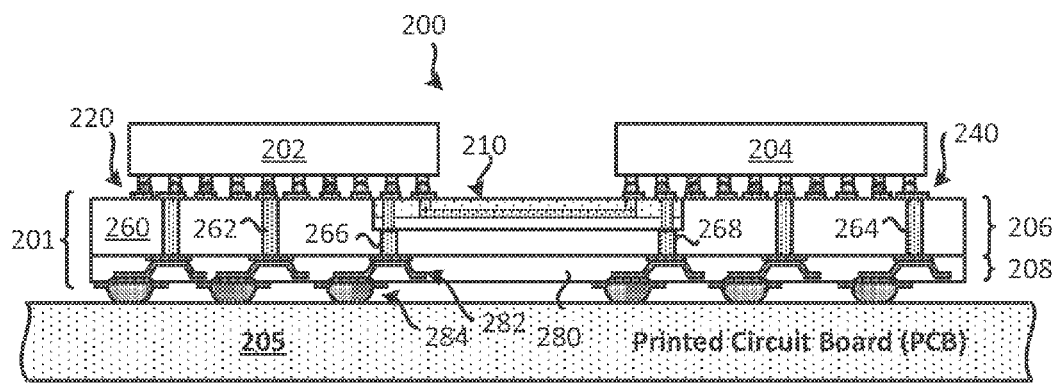
FIG. 2 illustrates an example of an integrated device package comprising a high density interconnect bridge, with through substrate vias, in an encapsulation layer.

FIG. 2 illustrates an example of an integrated device package that includes high density die-to-die interconnects. Specifically, FIG. 2 illustrates an example of an integrated device package 200 that includes a base 201, a first die 202, a second die 204, and a bridge 210. The bridge 210 may be configured to provide high density die-to-die interconnects. The integrated device package 200 may be coupled to a printed circuit board (PCB) 205.

The base 201 may be an integrated device package base. For example, the base 201 may be a package substrate. The base 201 includes an encapsulation portion 206 and a redistribution portion 208. The encapsulation portion 206 is coupled to the redistribution portion 208. The encapsulation portion 206 includes an encapsulation layer 260, the bridge 210, and at least one via (e.g., via 266) that is coupled to the bridge 210. The bridge 210 is at least partially embedded in the encapsulation layer 260. The bridge 210 is configured to provide a first electrical path for a first signal (e.g., input/output signal) between the first die 202 and the second die 204. The at least one via and the bridge 210 are configured to provide a second electrical path for a second signal (e.g., power signal) to the first die 202.

As shown in FIG. 2, the first die 202 is coupled to the base 201 through a first set of interconnects 220. The first set of interconnects 220 may include posts, pillars and/or solder. The second die 204 is coupled to the base 201 through a second set of interconnects 240. The second set of interconnects 240 may include posts, pillars and/or solder.

High Density Interconnect Bridge Comprising Through Substrate Vias

FIG. 2 illustrates that the bridge 210 is located at least partially in the base 201. Specifically, the bridge 210 is at least partially embedded in the encapsulation portion 206. As shown in FIG. 2, the bridge 210 is at least partially embedded in the encapsulation layer 260. The bridge 210 may comprise a silicon bridge, a glass bridge, and/or a ceramic bridge. As mentioned above, the bridge 210 is configured to provide high density die-to-die interconnects in the integrated device package 200. For example the bridge 210 is configured to provide high density interconnects between the first die 202 and the second die 204 (e.g., high density electrical paths for signals (e.g., input/output signals) between the first die 202 and the second die 204). Thus, in one example, the bridge 210 may be configured to provide at least one first electrical path for at least one first signal between the first die 202 and the second die 204. The at least one first electrical path for at least one first signal may include and/or may be defined by several interconnects (e.g., traces, vias) in the bridge 210. Such interconnects that define the at least one first electrical path are further described in detail below in at least FIGS. 4-5.

High density interconnects and/or high density electrical paths may refer to any density of wiring or connections per unit area than conventional printed circuit boards and may comprise finer lines and pitch, smaller vias and capture pads, as well as higher connection pad density. High density interconnects may thus be useful to reduce the size, thickness, weight, etc. of the package and/or device as well as enhancing electrical and thermal performance. High density interconnects may be defined by interconnects that include a width of about 2 microns (µm) or less, a pitch of about 4 microns (µm) or less, and/or a spacing of about 2 microns (µm) or less. The pitch of interconnects may be a center to center distance between two adjacent interconnects. The spacing of interconnects may be an edge to edge distance between two adjacent interconnects. Examples of width, pitch and spacing for high density interconnects are further described below in at least FIGS. 4-5.

The bridge 210 may include a substrate, a dielectric layer, a set of high density interconnects (e.g., traces, vias), and at least one through substrate via (TSV). The substrate may comprise silicon, glass and/or ceramic. The substrate, the dielectric layer, the set of high density interconnects (e.g., traces, vias), and the through substrate via (TSV) of the bridge 210 are not numbered or labeled in FIG. 2. However, a detailed exemplary bridge is illustrated and described below in at least FIGS. 4-5.

As shown in FIG. 2, the first die 202 is coupled to (e.g., in communication with) the second die 204 through at least the bridge 210. Specifically, FIG. 2 illustrates that the first die 202 is coupled to the second die 204 through the first set of interconnects 220, interconnects (e.g., vias, traces) in the bridge 210, and the second set of interconnects 240. In some implementations, the first set of interconnects 220, interconnects (e.g., vias, traces) in the bridge 210, and the second set of interconnects 240 provide several high density electrical paths for signals (e.g., input/output signals) between the first die 202 and the second die 204.

In some implementations, at least one through substrate via (TSV) is configured to provide at least one electrical path for a power signal and/or a ground reference signal to and/from a die coupled to the bridge 210. FIG. 2 illustrates that at least one power signal and/or a ground reference signal can traverse through the bridge 210 to the first die 202 and/or the second die 204. For example, the bridge 210 is configured to provide a second electrical path for a second signal (e.g., power signal) to the first die 202.

There are several advantages to providing a bridge that includes at least one TSV configured to provide an electrical path for a power signal and/or ground reference signal to and from one or more dies. First, an electrical path through the bridge 210 is a more direct path to and from a die, which means a shorter path to and from the die. Second, an electrical path through the bridge 210 means that the electrical path does not need to be routed around the bridge, saving space and real estate in the base 201, which can result in an overall smaller form factor for the integrated device package 200. Third, a more direct path for the power signal and/or ground reference signal means that less material is used, thereby reducing the cost of fabricating the integrated device package.

Fourth, high frequency die-to-die communication through a bridge may require a die-to-die (D2D) buffer (which is not shown). In some implementations, the D2D buffer is located in a die coupled to a bridge (e.g., in the die portion that is vertically over the bridge) that is adapted and/or configured to provide die-to-die communication. Each die that is coupled to a bridge may include its own respective D2D buffer. The D2D buffer may include at least one transistor. The D2D buffer may need a power supply (e.g., power signal), and it may be important to have the smallest possible power voltage drop in the signal (e.g., in the power signal) to the D2D buffer (e.g., to a transistor of the D2D buffer). This can be achieved by routing the power signal to the D2D buffer (e.g., D2D of the die) through the bridge. A die may have an interconnect to the D2D buffer, that has a metal thickness (e.g., copper thickness) of about 2 microns (µm) or less and a lateral length that is greater than 1000 microns (µm), which produces a high IR drop in the power signal, where IR is a current resistance. In contrast, an interconnect through a bridge to the D2D buffer may have a length of about 100 microns (µm) and a metal thickness (e.g., copper thickness) of about 10 microns (µm), which provides less voltage drop to the D2D buffer, and thus provides improved die-to-die communication performance.

FIG. 2 shows a high level illustration of a high density interconnect bridge (e.g., bridge 210) that includes at least one TSV configured to provide at least one electrical path for a power signal and/or ground reference signal to and from at least one die. As mentioned above, a more detailed description of high density bridges that include at least one TSV configured to provide an electrical path for power signals and/or ground reference signals are further illustrated and described below in at least FIGS. 4-10.

Integrated Device Package Base Comprising High Density Interconnect Bridge that Includes TSVs As mentioned above, the base 201 includes the encapsulation portion 206 and the redistribution portion 208. The base 201 may be an integrated device package base and/or a package substrate of the integrated device package 200.

The encapsulation portion 206 includes an encapsulation layer 260, a first set of vias 262, a second set of vias 264, a third set of vias 266, and a fourth set of vias 268. A set of vias may include one or more vias. The encapsulation layer 260 may include one of at least a mold and/or an epoxy fill. In some implementations, the encapsulation layer 260 may be a litho-patternable layer (e.g., litho-etchable layer). The litho-patternable layer is a material that is photo patternable and developable (e.g., photo etchable). That is, the encapsulation layer 260 is made of a material that can be patterned, developed, etched and/or removed through the exposure of the material to a light source (e.g., ultraviolet (UV) light). The bridge 210 is at least partially embedded in the encapsulation portion 206 and/or the encapsulation layer 260. Thus, the encapsulation portion 206 and/or the encapsulation layer 260 at least partially encapsulates the bridge 210. The encapsulation layer 260 may be a mold and/or an epoxy fill. In some implementations, the encapsulation layer 260 is a layer that includes filler. In some implementations, the encapsulation layer 260 may have higher concentration of filler material than a Polyimide (PI) layer and/or a Polybenzoxazole (PBO) layer.

The first set of vias 262 vertically traverses at least part of the encapsulation layer 260. Thus, the first set of vias 262 is located and/or embedded in the encapsulation layer 260. The first set of vias 262 is coupled to the redistribution portion 208. The first set of vias 262 is also coupled to the first die 202 through the first set of interconnects 220. In some implementations, the encapsulation portion 206 includes a set of pads. The set of pads may be coupled to the first set of vias 262 and the first set of interconnects 220. Examples of pads in an encapsulation portion are further described below in at least FIGS. 6-10.

The second set of vias 264 vertically traverses at least part of the encapsulation layer 260. Thus, the second set of vias 264 is located and/or embedded in the encapsulation layer 260. The second set of vias 264 is coupled to the redistribution portion 208. The second set of vias 264 is also coupled to the second die 204 through the second set of interconnects 240. In some implementations, the encapsulation portion 206 includes a set of pads. The set of pads may be coupled to the second set of vias 264 and the second set of interconnects 240.

The third set of vias 266 vertically traverses at least part of the encapsulation layer 260. Thus, the third set of vias 266 is located and/or embedded in the encapsulation layer 260. The third set of vias 266 is coupled to the redistribution portion 208. The third set of vias 266 is also coupled to the first die 202 through the bridge 210 and the first set of interconnects 220. The third set of vias 266 is coupled to the through substrate vias (TSVs) of the bridge 210. In some implementations, the encapsulation portion 206 includes a set of pads. The set of pads may be coupled to the bridge 210 and the first set of interconnects 220.

In some implementations, the third set of vias 266 is configured to provide at least one electrical path for at least one power signal and/or at least one ground reference signal to and from a die (e.g., first die 202), through the bridge 210. For example, in some implementations, a via (e.g., from the vias 266) and the bridge 210 may be configured to provide a second electrical path for a second signal (e.g., power signal) to the first die 202.

The fourth set of vias 268 vertically traverses at least part of the encapsulation layer 260. The fourth set of vias 268 is coupled to the redistribution portion 208. The fourth set of vias 268 is also coupled to the second die 204 through the bridge 210 and the second set of interconnects 240. The fourth set of vias 268 is coupled to the through substrate vias (TSVs) of the bridge 210. In some implementations, the encapsulation portion 206 includes a set of pads. The set of pads may be coupled to the bridge 210 and the second set of interconnects 240.

In some implementations, the fourth set of vias 268 is configured to provide at least one electrical path for at least one power signal and/or at least one ground reference signal to and from a die (e.g., second die 204), through the bridge 210.

In some implementations, the vias in the encapsulation portion 206 are vias that have a width/diameter of about 10 microns (μm) or less, and/or a spacing of about 10 microns (μm) or less. Thus, in some implementations, the vias in the encapsulation portion 206 are interconnects that have lower density than the interconnects in the bridge 210. In some implementations, at least a majority of the vias in the encapsulation portion 206 have lower density (e.g., greater width, greater spacing) than the interconnects (e.g., traces, vias) in the bridge 210.

The vias (e.g., first set of vias 262, second set of vias 264, third set of vias 266, fourth set of vias 268) may have different shapes and sizes. Various examples of shapes for the vias in the encapsulation layer are further illustrated and described below in at least FIGS. 6-10.

The redistribution portion 208 includes a set of dielectric layers 280, and a set of interconnects 282. The set of dielectric layers 280 may include one or more dielectric layers. As shown in FIG. 2, the redistribution portion 208 is coupled to a first surface (e.g., bottom surface) of the encapsulation portion 206. The set of interconnects 282 may include a trace, a via, a pad, a redistribution interconnect, and/or an under bump metallization (UBM) layer. As further shown in FIG. 2, the set of interconnects 282 includes redistribution interconnects and UBM layers. The set of interconnects 282 is coupled to the first set of vias 262, the second set of vias 264, the third set of vias 266, and the fourth set of vias 268. Some of the set of interconnects 282 may be configured to provide at least one electrical path for at least one power signal and/or at least one ground reference signal. In some implementations, the set of interconnects 282 in the redistribution portion 208 are interconnects that have a width of about 5 microns (μm) or less, and/or a spacing of about 5 microns (μm) or less. More detailed examples of various redistribution portions are further described in at least FIGS. 6-10. FIG. 2 illustrates a set of solder balls 284 that is coupled to the set of interconnects 282. In some implementations, the set of solder balls 284 is coupled to UBM layers of the set of interconnects 282. The set of solder balls 284 is coupled to the PCB 205.

Although not shown, the integrated device package 200 may also include another encapsulation layer that covers the first die 202 and the second die 204. The encapsulation layer may include one of at least a mold and/or an epoxy fill.

Exemplary Integrated Device Package Comprising Bridge in Litho-Etchable Layer

Figure 3:
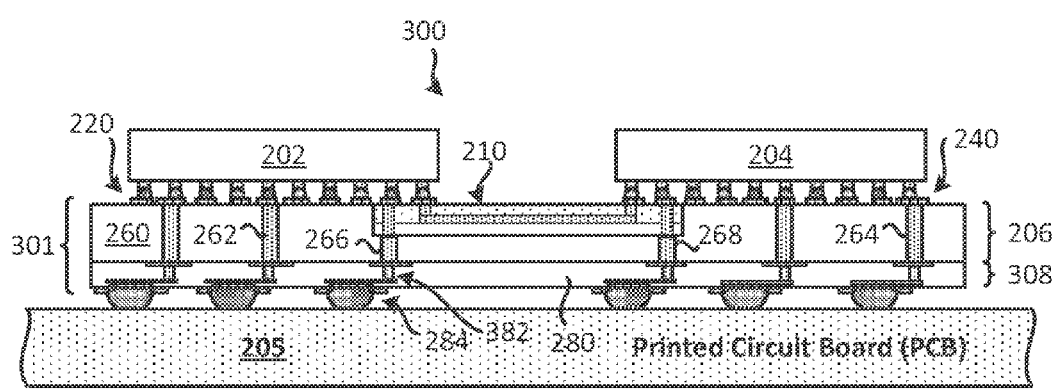
FIG. 3 illustrates an example of an integrated device package comprising a high density interconnect bridge, with through substrate vias, in an encapsulation layer.

FIG. 3 illustrates another example of an integrated device package that includes high density die-to-die interconnects. Specifically, FIG. 3 illustrates an example of an integrated device package 300 that includes a base 301, the first die 202, the second die 204, and the bridge 210. The base 301 may be an integrated device package base and/or a package substrate of the integrated device package 300. The base 301 includes the encapsulation portion 206 and a redistribution portion 308. The integrated device package 300 is coupled to the printed circuit board (PCB) 205.

The integrated device package 300 is similar to the integrated device package 200, except that in some implementations, the redistribution portion 308 includes a different configuration of interconnects.

As shown in FIG. 3, the first die 202 is coupled to the base 201 through the first set of interconnects 220. The first set of interconnects 220 may include posts, pillars and/or solder. The second die 204 is coupled to the base 201 through the second set of interconnects 240. The second set of interconnects 240 may include posts, pillars and/or solder.

As shown in FIG. 3, the redistribution portion 308 is coupled to the encapsulation portion 206. The redistribution portion 308 includes a set of dielectric layers 280, and a set of interconnects 382. The set of dielectric layers 280 may include one or more dielectric layers. As shown in FIG. 3, the redistribution portion 308 is coupled to a first surface (e.g., bottom surface) of the encapsulation portion 206. The set of interconnects 382 may include a trace, a via, a pad, a redistribution interconnect, and/or an under bump metallization (UBM) layer. As further shown in FIG. 3, the set of interconnects 382 includes pads, vias, traces, and UBM layers. The set of interconnects 382 is coupled to the first set of vias 262, the second set of vias 264, the third set of vias 266, and the fourth set of vias 268. Some of the set of interconnects 382 may be configured to provide at least one electrical path for at least one power signal and/or at least one ground reference signal. In some implementations, the set of interconnects 382 in the redistribution portion 308 are interconnects that have a width of about 5 microns (µm) or less, and/or a spacing of about 5 microns (µm) or less. More detailed examples of various redistribution portions are further described in at least FIGS. 6-10. FIG. 3 illustrates the set of solder balls 284 is coupled to the set of interconnects 382. In some implementations, the set of solder balls 284 is coupled to UBM layers of the set of interconnects 382. The set of solder balls 284 is coupled to the PCB 205.

Although not shown, the integrated device package 300 may also include another encapsulation layer that covers the first die 202 and the second die 204. The encapsulation layer may include one of at least a mold and/or an epoxy fill.

Exemplary Bridge Comprising Interconnects and Through Substrate Vias (TSVs)

Figure 4:
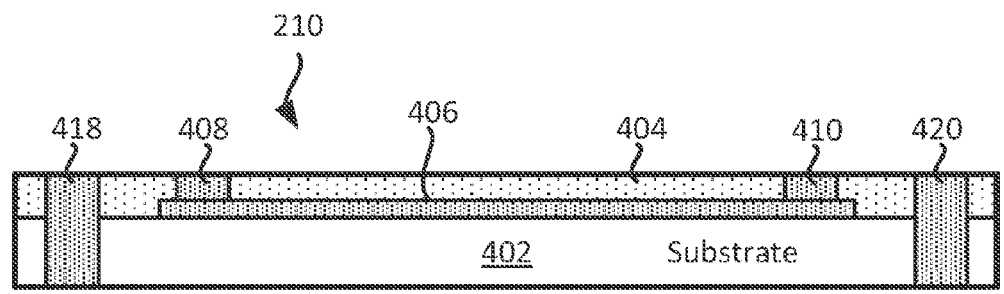
FIG. 4 illustrates an example of a profile view of a high density interconnect bridge with through substrate vias (TSVs).
Figure 5:
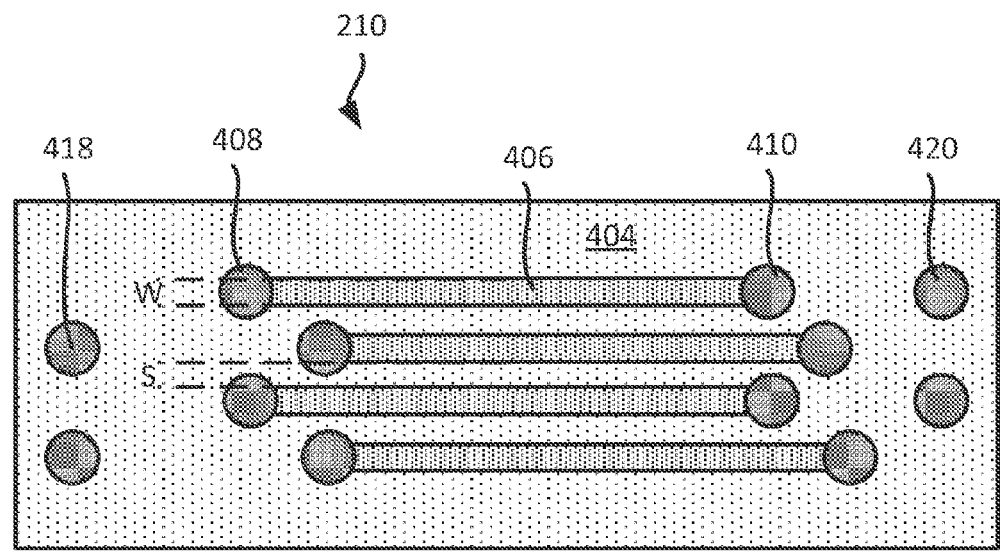
FIG. 5 illustrates an example of a plan view of a high density interconnect bridge with through substrate vias (TSVs).

As mentioned above, an integrated device package may include a bridge (e.g., silicon bridge, glass bridge, ceramic bridge) that is configured to provide high density die-to-die interconnects, and through substrate vias (TSVs) configured to provide at least one electrical path for at least one power signal and/or at least one ground reference signal to and from one or more dies. FIGS. 4 and 5 illustrate conceptual examples of such bridges configured to provide high density interconnects and TSVs in an integrated device package.

FIG. 4 illustrates a profile view of an example of the bridge 210 (e.g., silicon bridge). The bridge 210 includes a substrate 402, a dielectric layer 404, at least one first interconnect 406, at least one second interconnect 408, at least one third interconnect 410, at least one fourth interconnect 418, and at least one fifth interconnect 420. In some implementations, the bridge 210 may be implemented in any of the integrated device package illustrated and described in the present disclosure. For example, the bridge 210 may be the bridge of FIGS. 2-3. In some implementations, the bridge 210 is a means (e.g., bridge means) for providing a die-to-die electrical path or die-to-die electrical connection between a first die and a second die. For example, the at least one first interconnect 406, the at least one second interconnect 408, and the at least on third interconnect 410 may define at least one first electrical path for at least one first signal between a first die and a second die. In some implementations, the at least one first interconnect 406, the at least one second interconnect 408, and the at least on third interconnect 410 may form at least one first set of interconnects that is configured to provide at least one first electrical path for at least one first signal between a first die and a second die.

In some implementations, the bridge 210 is a means (e.g., bridge means) for providing at least one second electrical path for at least a power signal and/or at least a ground reference signal to and from a first die. In some implementations, the bridge 210 is a means (e.g., bridge means) for providing at least one third electrical path for at least a power signal and/or at least a ground reference signal to and from a second die.

In some implementations, the means (e.g., bridge means) provides an interconnection density that is equal or higher than the interconnection density of the encapsulation portion (e.g., encapsulation portion 206) and/or the redistribution portion (e.g., redistribution portion 208) of an integrated device package base.

In some implementations, the substrate 402 comprises a silicon substrate, a glass substrate, and/or a ceramic substrate. The first interconnect 406 may be at least one trace located on the substrate 402. The dielectric layer 404 covers the first interconnect 406 and the substrate 402. In some implementations, the second and third interconnects 408 and 410 are vias that vertically traverses the dielectric layer 404. The second and third interconnects 408 and 410 are coupled to the first interconnect 406.

In some implementations, the first, second, and third interconnects 406, 408 and 410 are high density interconnects. In some implementations, high density interconnects are interconnects that have a width of about 2 microns (µm) or less, and/or a spacing of about 2 microns (µm) or less. In some implementations, the width of an interconnect may be the width of the trace and/or line. In some implementations, the width of an interconnect may be the diameter of a via and/or a pad. A spacing is an edge to edge distance between two neighboring/adjacent interconnects.

The fourth interconnect 418 may be a via that traverses the substrate 402 and the dielectric layer 404. The fourth interconnect 418 may be a through substrate via (TSV) that traverses the substrate 402 and the dielectric layer 404. In some implementations, the fourth interconnect 418 may be a combination of two or more vias (e.g., first via in the substrate 402 and a second via in the dielectric layer 404). In some implementations, the fourth interconnect 418 is configured to provide at least one electrical path (e.g., second electrical path) for at least one second signal (e.g., at least one power signal and/or at least one ground reference signal) to and from a die (e.g., first die).

The fifth interconnect 420 may be a via that traverses the substrate 402 and the dielectric layer 404. The fifth interconnect 420 may be a through substrate via (TSV) that traverses the substrate 402 and the dielectric layer 404. In some implementations, the fifth interconnect 420 may be a combination of two or more vias (e.g., first via in the substrate 402 and a second via in the dielectric layer 404). In some implementations, the fifth interconnect 420 is configured to provide at least one electrical path (e.g., third electrical path) for at least one third signal (e.g., at least one power signal and/or at least one ground reference signal) to and from a die (e.g., second die). In some implementations, the fourth and fifth interconnects 418 and 420 are high density interconnects.

It is noted that the bridge 210 may include several first interconnects, second interconnects, third interconnects, fourth interconnects, and fifth interconnects.

FIG. 5 illustrates a plan view (e.g., top view) of an example of the bridge 210 (e.g., silicon bridge) that includes a substrate (not visible), the dielectric layer 404, the first interconnect 406, the second interconnect 408, the third interconnect 410, the fourth interconnect 418, and the fifth interconnect 420. FIG. 5 illustrates the width and spacing of interconnects. The width of an interconnect is illustrated by (W), and the spacing between two neighboring/adjacent interconnects is illustrated by (S). In some implementations, the first interconnect 406, the second interconnect 408, the third interconnect 410, the fourth interconnect 418, and/or the fifth interconnect 420 are high density interconnects. In some implementations, high density interconnects are interconnects that have a width of about 2 microns (μm) or less, and/or a spacing of about 2 microns (μm) or less.

As described above, there are several advantages in providing a bridge that includes at least one TSV configured to provide an electrical path for a power signal and/or ground reference signal to and from one or more dies. First, an electrical path through the bridge 210 is a more direct path to and from a die, which means a shorter path to and from the die. Second, an electrical path through the bridge 210 means that the electrical path does not need to be routed around the bridge, saving space and real estate in the base 201, which can result in an overall smaller form factor for the integrated device package 200. Third, a more direct path for the power signal and/or ground reference signal means that less material is used, thereby reducing the cost of fabricating the integrated device package. Fourth, TSVs may help provide improved performance in die-to-die communication.

Exemplary Integrated Device Package Comprising Bridge Litho-Etchable Layer

Having described an example of an integrated device package that includes high density die-to-die interconnects in general detail, examples of integrated device packages that includes high density die-to-die interconnects and through substrate vias (TSVs) will now be described in more detail.

Figure 6:
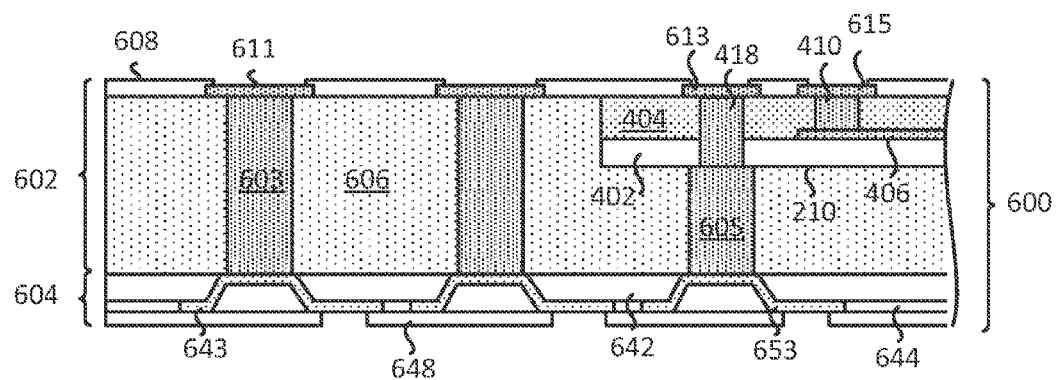
FIG. 6 illustrates an example of a profile view of an integrated device package base comprising a high density interconnect bridge, with through substrate vias, in an encapsulation layer.

FIG. 6 illustrates an example of a portion of integrated device package base 600 of an integrated device package. In some implementations, the integrated device package base 600 may correspond to at least the encapsulation portion 206 and the redistribution portion 208 of FIG. 2. In some implementations, the integrated device package base 600 is a package substrate of an integrated device package.

The integrated device package base 600 includes an encapsulation portion 602 and a redistribution portion 604. The encapsulation portion 602 includes an encapsulation layer 606, a first via 603, a second via 605, a first pad 611, a second pad 613, a third pad 615, a solder resist layer 608, and the bridge 210. In some implementations, the encapsulation layer 606 is a litho-patternable material (e.g., litho-etchable material) that is photo patternable and developable (e.g., photo etchable). That is, the encapsulation layer 606 is made of a material that can be patterned, develop, etched and/or removed through the exposure of the material to a light source (e.g., ultraviolet (UV) light). The encapsulation layer 606 may include one of at least a mold and/or an epoxy fill.

The first via 603 vertically traverses the encapsulation layer 606. The first pad 611 is coupled to the first via 603. The second via 605 vertically traverses the encapsulation layer 606. Thus, the second via 605 is located and/or embedded in the encapsulation layer 606. The second via 605 is coupled to the interconnect 418 of the bridge 210. The interconnect 418 may be a through substrate via (TSVs) of the bridge 210. The second pad 613 is coupled to the interconnect 418. In some implementations, the second via 605, the interconnect 418, and the second pad 613 are configured to provide an electrical path (e.g., second electrical path) for a second signal (e.g., a power signal and/or a ground reference signal) to and from a die (e.g., first die 202).

The solder resist layer 608 covers a first surface (e.g., top surface) of the encapsulation layer 606. A solder ball may be coupled to the pads 611, 613, and/or 615. The via 603 is part of a set of vias in the encapsulation layer 606, where the set of vias has a first density (e.g., first width and/or first spacing).

FIG. 6 also illustrates that the bridge 210 is at least partially embedded in the encapsulation layer 606 of the encapsulation portion 602. The bridge 210 is configured to provide high density electrical paths (e.g., high density die-to-die interconnects) in the encapsulation portion 602. The bridge 210 is also configured to provide an electrical path for a signal (e.g., power signal) to a die through the substrate 402 of the bridge 210.

The redistribution portion 604 is coupled to the encapsulation portion 602. The redistribution portion 604 includes a first dielectric layer 642, a second dielectric layer 644, and a third dielectric layer 648, an interconnect 643, and an interconnect 653. In some implementations, the first, second, and/or third dielectric layers 642, 644, and/or 648 may be collectively a single dielectric layer. The interconnects 643 and 653 may be redistribution interconnects comprising a diagonal portion and a horizontal portion. In some implementations, the interconnects 643 and 653 are U or V shaped redistribution interconnects. In some implementations, the interconnects 643 and 653 may be configured to couple to solder balls (e.g., printed circuit board side solder balls).

The interconnect 643 of the redistribution portion 604 is coupled to the via 603 of the encapsulation portion 602. The interconnect 653 of the redistribution portion 604 is coupled to the second via 605 in the encapsulation portion 602. In some implementations, the interconnect 653, the second via 605, the interconnect 418, and the second pad 613 are configured to provide an electrical path for a power signal and/or a ground reference signal to and from a die (e.g., first die 202).

In some implementations, a first die (e.g., die 202) may be electrically coupled to a second die (e.g., second die 204) through the third pad 615, the interconnect 410, and the interconnect 406. In some implementations, the third pad 615, the interconnect 410, and the interconnect 406 define an electrical path for die-to-die connection between the first and second dies (e.g., dies 202 and 204).

Exemplary Integrated Device Package Comprising Bridge Litho-Etchable Layer

Figure 7:
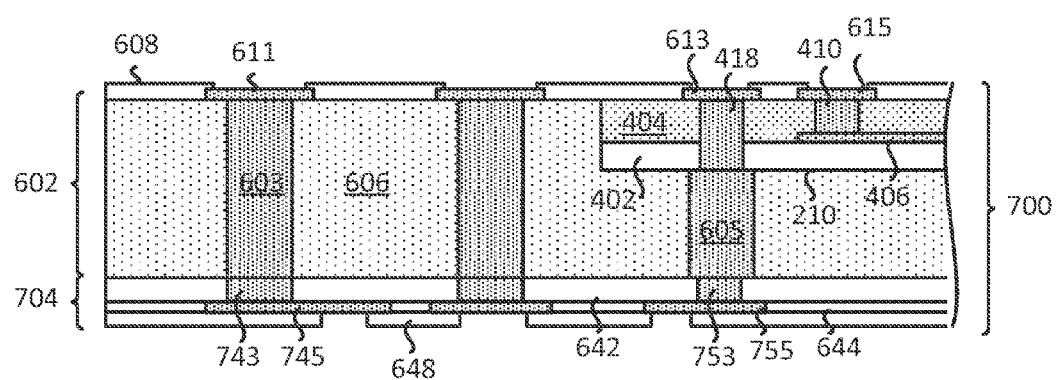
FIG. 7 illustrates another example of a profile view of an integrated device package base comprising a high density interconnect bridge, with through substrate vias, in an encapsulation layer.

FIG. 7 illustrates another example of a portion of integrated device package base 700 of an integrated device package. In some implementations, the integrated device package base 700 may correspond to at least the encapsulation portion 206 and the redistribution portion 308 of FIG. 3. In some implementations, the integrated device package base 700 is a package substrate of an integrated device package.

The integrated device package base 700 includes an encapsulation portion 602 and a redistribution portion 704. The encapsulation portion 602 includes an encapsulation layer 606, a first via 603, a second via 605, a first pad 611, a second pad 613, a third pad 615, a solder resist layer 608, and the bridge 210. In some implementations, the encapsulation layer 606 is a litho-patternable material (e.g., litho-etchable material) that is photo patternable and developable (e.g., photo etchable). That is, the encapsulation layer 606 is made of a material that can be patterned, develop, etched and/or removed through the exposure of the material to a light source (e.g., ultraviolet (UV) light). The encapsulation layer 606 may include one of at least a mold and/or an epoxy fill.

The first via 603 vertically traverses the encapsulation layer 606. The first pad 611 is coupled to the first via 603. The second via 605 vertically traverses the encapsulation layer 606. The second via 605 is coupled to the interconnect 418 of the bridge 210. The interconnect 418 may be a through substrate via (TSVs) of the bridge 210. The second pad 613 is coupled to the interconnect 418. In some implementations, the second via 605, the interconnect 418, and the second pad 613 are configured to provide an electrical path for a power signal and/or a ground reference signal to and from a die (e.g., first die 202).

The solder resist layer 608 covers a first surface (e.g., top surface) of the encapsulation layer 606. A solder ball may be coupled to the pads 611, 613, and/or 615. The via 603 is part of a set of vias in the encapsulation layer 606, where the set of vias has a first density (e.g., first width and/or first spacing).

FIG. 7 also illustrates that the bridge 210 is at least partially embedded in the encapsulation layer 606 of the encapsulation portion 602. The bridge 210 is configured to provide high density electrical paths (e.g., high density die-to-die interconnects) in the encapsulation portion 602. The bridge 210 is also configured to provide an electrical path for a signal (e.g., power signal) to a die through the substrate 402 of the bridge 210.

The redistribution portion 704 is coupled to the encapsulation portion 602. The redistribution portion 704 includes a first dielectric layer 642, a second dielectric layer 644, and a third dielectric layer 648, an interconnect 743, an interconnect 745, an interconnect 753, and an interconnect 755. In some implementations, the first, second, and/or third dielectric layers 642, 644, and/or 648 may be collectively a single dielectric layer. The interconnects 743 and 753 may be vias. The interconnects 745 and 755 may be traces and/or pads. In some implementations, the interconnects 745 and 755 may be configured to couple to solder balls (e.g., printed circuit board side solder balls).

The interconnect 745 is coupled to the interconnect 743. The interconnect 743 of the redistribution portion 704 is coupled to the via 603 of the encapsulation portion 602. The interconnect 755 is coupled to the interconnect 753. The interconnect 753 of the redistribution portion 704 is coupled to the second via 605 in the encapsulation portion 602. In some implementations, the interconnect 755, the interconnect 753, the second via 605, the interconnect 418, and the second pad 613 are configured to provide an electrical path for a power signal and/or a ground reference signal to and from a die (e.g., first die 202).

In some implementations, a first die (e.g., die 202) may be electrically coupled to a second die (e.g., second die 204) through the third pad 615, the interconnect 410, and the interconnect 406. In some implementations, the third pad 615, the interconnect 410, and the interconnect 406 define an electrical path for die-to-die connection between the first and second dies (e.g., dies 202 and 204).

Exemplary Integrated Device Package Comprising Bridge Litho-Etchable Layer

FIGS. 6-7 illustrate vias (e.g., via 603, via 605) in an encapsulation layer comprising a certain shapes. As shown in FIGS. 6-7 the vias in the encapsulation layer 606 are formed by filling cavities in the encapsulation layer 606. However, in some implementations, the vias in an encapsulation layer may have a different shape and/or configuration.

Figure 8:
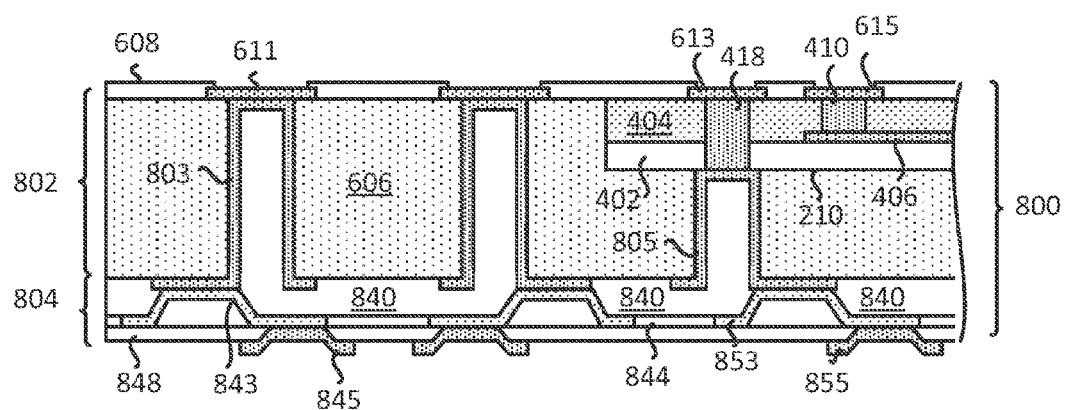
FIG. 8 illustrates an example of a profile view of an integrated device package base comprising a high density interconnect bridge, with through substrate vias, in an encapsulation layer.
Figure 9:
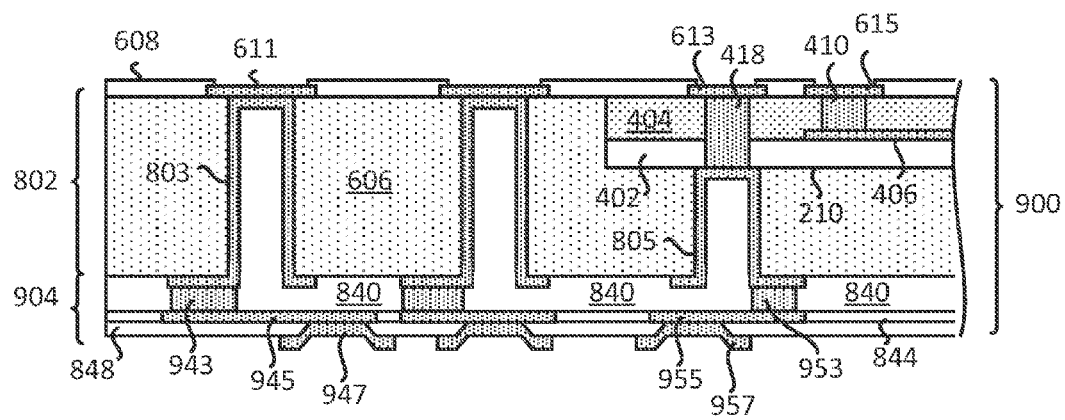
FIG. 9 illustrates another example of a profile view of an integrated device package base comprising a high density interconnect bridge, with through substrate vias, in an encapsulation layer.

FIGS. 8-9 illustrate vias in an encapsulation layer comprising different shapes. As shown in FIGS. 8-9 and further described below, the vias in the encapsulation layer are formed by conform fill, where one or more metal layers are formed on the walls of the cavities leaving another cavity that is filled with a dielectric layer. In some implementations, the vias have a bowl or can-like shape.

FIG. 8 illustrates an example of a portion of integrated device package base 800 of an integrated device package. In some implementations, the integrated device package base 800 may correspond to at least the encapsulation portion 206 and the redistribution portion 208 of FIG. 2. In some implementations, the integrated device package base 800 is a package substrate of an integrated device package.

The integrated device package base 800 includes an encapsulation portion 802 and a redistribution portion 804. The encapsulation portion 802 includes an encapsulation layer 606, a first via 803, a second via 805, a first pad 611, a second pad 613, a third pad 615, a solder resist layer 608, and the bridge 210. In some implementations, the encapsulation layer 606 is a litho-patternable material (e.g., litho-etchable material) that is photo patternable and developable (e.g., photo etchable). That is, the encapsulation layer 606 is made of a material that can be patterned, develop, etched and/or removed through the exposure of the material to a light source (e.g., ultraviolet (UV) light). The encapsulation layer 606 may include one of at least a mold and/or an epoxy fill.

As shown in FIG. 8, the first via 803 includes a V shape profile cross section or a U shape profile cross section. The first via 803 may be a conform fill via that forms the shape of the cavity in which it is formed. In this example, the first via 803 is formed along at least the walls of the cavity in which it is formed. The first via 803 also includes a wing portion that is formed in the redistribution portion 804. The wing portion of the first via 803 traverses laterally in the redistribution portion 804. The wing portion may be referred to as a wing interconnect of the via. The first via 803 vertically traverses the encapsulation layer 606. The first pad 611 is coupled to the first via 803. The second via 805 also includes a V shape profile cross section or a U shape profile cross section. The second via 805 may be a conform fill via that forms the shape of the cavity in which it is formed. In this example, the second via 805 is formed along at least the walls of the cavity in which it is formed. The second via 805 also includes a wing portion that is formed in the redistribution portion 804. The wing portion of the second via 805 traverses laterally in the redistribution portion 804. A dielectric layer 840 is located within the cavity created by the vias (e.g., via 803, via 805) of the encapsulation layer 606. The second via 805 vertically traverses the encapsulation layer 606. Thus, the second via 805 is at least partially located and/or at least partially embedded in the encapsulation layer 606. The second via 805 is coupled to the interconnect 418 of the bridge 210. The interconnect 418 may be a through substrate via (TSVs) of the bridge 210. The second pad 613 is coupled to the interconnect 418. In some implementations, the second via 805, the interconnect 418, and the second pad 613 are configured to provide an electrical path for a power signal and/or a ground reference signal to and from a die (e.g., first die 202).

The solder resist layer 608 covers a first surface (e.g., top surface) of the encapsulation layer 606. A solder ball may be coupled to the pads 611, 613, and/or 615. The via 803 is part of a set of vias in the encapsulation layer 606, where the set of vias has a first density (e.g., first width and/or first spacing).

FIG. 8 also illustrates that the bridge 210 is at least partially embedded in the encapsulation layer 606 of the encapsulation portion 802. The bridge 210 is configured to provide high density electrical paths (e.g., high density die-to-die interconnects) in the encapsulation portion 802. The bridge is also configured to provide an electrical path for a signal (e.g., power signal) to a die through the substrate 402 of the bridge 210.

The redistribution portion 804 is coupled to the encapsulation portion 802. The redistribution portion 804 includes dielectric layer 840, a dielectric layer 844, and a dielectric layer 848, an interconnect 843, and an interconnect 853. In some implementations, the dielectric layers 840, 844, and/or 848 may be collectively a single dielectric layer. The interconnects 843 and 853 may be redistribution interconnects comprising a diagonal portion and a horizontal portion. In some implementations, the interconnects 843 and 853 include U or V shaped redistribution interconnects. In some implementations, the interconnects 843 and 853 may be configured to couple to solder balls (e.g., printed circuit board side solder balls).

The interconnect 843 of the redistribution portion 804 is coupled to the via 803 of the encapsulation portion 802 (e.g., coupled to wing portion of the first via 803). The interconnect 853 of the redistribution portion 804 is coupled to the second via 805 (e.g., coupled to wing portion of the second via 805) in the encapsulation portion 802. In some implementations, the interconnect 853, the second via 805, the interconnect 418, and the second pad 613 are configured to provide an electrical path for a power signal and/or a ground reference signal to and from a die (e.g., first die 202).

FIG. 8 illustrates that the redistribution portion 804 may also include a first under bump metallization (UBM) layer 845 and a second under bump metallization (UBM) layer 855. The first UBM layer 845 is coupled to the interconnect 843. The second UBM layer 855 is coupled to the interconnect 853. In some implementations, the first UBM layer 845 and the second UBM layer 855 are configured to couple to solder balls.

In some implementations, a first die (e.g., die 202) may be electrically coupled to a second die (e.g., second die 204) through the third pad 615, the interconnect 410, and the interconnect 406. In some implementations, the third pad 615, the interconnect 410, and the interconnect 406 define an electrical path for die-to-die connection between the first and second dies (e.g., dies 202 and 204).

Exemplary Integrated Device Package Comprising Bridge Litho-Etchable Layer

FIG. 9 illustrates another example of a portion of integrated device package base 900 of an integrated device package. In some implementations, the integrated device package base 900 may correspond to at least the encapsulation portion 206 and the redistribution portion 308 of FIG. 3. In some implementations, the integrated device package base 900 is a package substrate of an integrated device package.

The integrated device package base 900 includes an encapsulation portion 802 and a redistribution portion 904. The encapsulation portion 802 includes an encapsulation layer 606, a first via 803, a second via 805, a first pad 611, a second pad 613, a third pad 615, a solder resist layer 608, and the bridge 210. In some implementations, the encapsulation layer 606 is a litho-patternable material (e.g., litho-etchable material) that is photo patternable and developable (e.g., photo etchable). That is, the encapsulation layer 606 is made of a material that can be patterned, develop, etched and/or removed through the exposure of the material to a light source (e.g., ultraviolet (UV) light). The encapsulation layer 606 may include one of at least a mold and/or an epoxy fill.

As shown in FIG. 9, the first via 803 includes a V shape profile cross section or a U shape profile cross section. The first via 803 may be a conform fill via that forms the shape of the cavity in which it is formed. In this example, the first via 803 is formed along at least the walls of the cavity in which it is formed. The first via 803 also includes a wing portion that is formed in the redistribution portion 904. The wing portion of the first via 803 traverses laterally in the redistribution portion 904. The wing portion may be referred to as a wing interconnect of the via. The first via 803 vertically traverses the encapsulation layer 606. The first pad 611 is coupled to the first via 803. The second via 805 also includes a V shape profile cross section or a U shape profile cross section. The second via 805 may be a conform fill via that forms the shape of the cavity in which it is formed. In this example, the second via 805 is formed along at least the walls of the cavity in which it is formed. The second via 805 also includes a wing portion that is formed in the redistribution portion 904. The wing portion of the second via 805 traverses laterally in the redistribution portion 904. A dielectric layer 840 is located within the cavity created by the vias (e.g., via 803, via 805) of the encapsulation layer 606. The second via 805 vertically traverses the encapsulation layer 606. The second via 805 is coupled to the interconnect 418 of the bridge 210. The interconnect 418 may be a through substrate via (TSVs) of the bridge 210. The second pad 613 is coupled to the interconnect 418. In some implementations, the second via 805, the interconnect 418, and the second pad 613 are configured to provide an electrical path for a power signal and/or a ground reference signal to and from a die (e.g., first die 202).

The solder resist layer 608 covers a first surface (e.g., top surface) of the encapsulation layer 606. A solder ball may be coupled to the pads 611, 613, and/or 615. The via 803 is part of a set of vias in the encapsulation layer 606, where the set of vias has a first density (e.g., first width and/or first spacing).

FIG. 9 also illustrates that the bridge 210 is at least partially embedded in the encapsulation layer 606 of the encapsulation portion 802. The bridge 210 is configured to provide high density electrical paths (e.g., high density die-to-die interconnects) in the encapsulation portion 802. The bridge is also configured to provide an electrical path for a signal (e.g., power signal) to a die through the substrate 402 of the bridge 210.

The redistribution portion 904 is coupled to the encapsulation portion 802. The redistribution portion 904 includes a dielectric layer 840, a dielectric layer 844, and a dielectric layer 848, an interconnect 943, an interconnect 945, an interconnect 953, and an interconnect 955. In some implementations, the dielectric layers 842, 844, and/or 848 may be collectively a single dielectric layer. The interconnects 943 and 953 may be vias. The interconnects 945 and 955 may be traces and/or pads. In some implementations, the interconnects 945 and 955 may be configured to couple to solder balls (e.g., printed circuit board side solder balls).

The interconnect 945 is coupled to the interconnect 943. The interconnect 943 of the redistribution portion 904 is coupled to the via 803 of the encapsulation portion 802 (e.g., coupled to the wing portion of the first via 803). The interconnect 955 is coupled to the interconnect 953. The interconnect 953 of the redistribution portion 904 is coupled to the second via 805 in the encapsulation portion 802 (e.g., coupled to the wing portion of the second via 805). In some implementations, the interconnect 955, the interconnect 953, the second via 805, the interconnect 418, and the second pad 613 are configured to provide an electrical path for a power signal and/or a ground reference signal to and from a die (e.g., first die 202).

FIG. 9 illustrates that the redistribution portion 904 may also include a first under bump metallization (UBM) layer 947 and a second under bump metallization (UBM) layer 957. The first UBM layer 947 is coupled to the interconnect 945. The second UBM layer 957 is coupled to the interconnect 955. In some implementations, the first UBM layer 947 and the second UBM layer 957 are configured to couple to solder balls.

In some implementations, a first die (e.g., die 202) may be electrically coupled to a second die (e.g., second die 204) through the third pad 615, the interconnect 410, and the interconnect 406. In some implementations, the third pad 615, the interconnect 410, and the interconnect 406 define an electrical path for die-to-die connection between the first and second dies (e.g., dies 202 and 204).

Exemplary Integrated Device Package Comprising Bridge Litho-Etchable Layer

Figure 10:
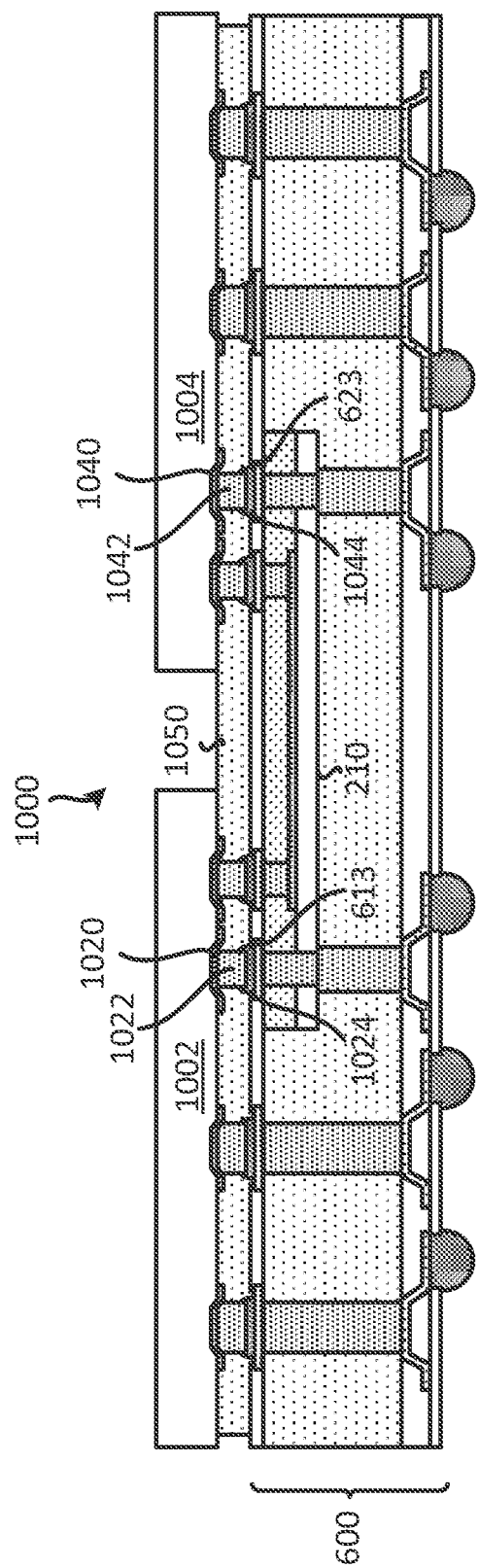
FIG. 10 illustrates an example of a profile view of an integrated device package comprising a high density interconnect bridge, with through substrate vias, in an encapsulation layer.

FIG. 10 illustrates an example of an integrated device package 1000 that includes two dies coupled to an integrated device package base. As shown in FIG. 10, the integrated device package 1000 includes a first die 1002 and a second die 1004, and the base 600. The first die 1002 and the second die 1004 are coupled to the base 600. It should be noted that the first die 1002 and the second die 1004 may be coupled to any of the integrated device package bases (e.g., base 201, base 301, base 700, base 800, base 900) described in the present disclosure.

The first die 1002 includes an under bump metallization (UBM) layer 1020 (optional), a pillar 1022, and solder 1024. The first die 1002 is coupled to the integrated device package base 600 through the UBM layer 1020 (optional), the pillar 1022, the solder 1024, and the pad 613 of the integrated device package base 600.

The second die 1004 includes an under bump metallization (UBM) layer 1040 (optional), a pillar 1042, and solder 1044. The second die 1004 is coupled to the integrated device package base 600 through the UBM layer 1040 (optional), the pillar 1042, the solder 1044, and the pad 623 of the integrated device package base 600.

As further shown, a fill 1050 is located between the first die 1002 and the integrated device package base 600. The fill 1050 may include at least a non-conducting fill (NCF) and/or a non-conducting paste (NCP). The fill 1050 covers the interconnects (e.g., pillar 1022, solder 1024, pad 613) between the first die 1002 and the integrated device package base 600. The fill 1050 is also located between the second die 1004 and the integrated device package base 600.

Exemplary Sequence for Providing/Fabricating a High Density Interconnect Bridge that Includes Through Substrate Vias (TSVs)

Figure 11:
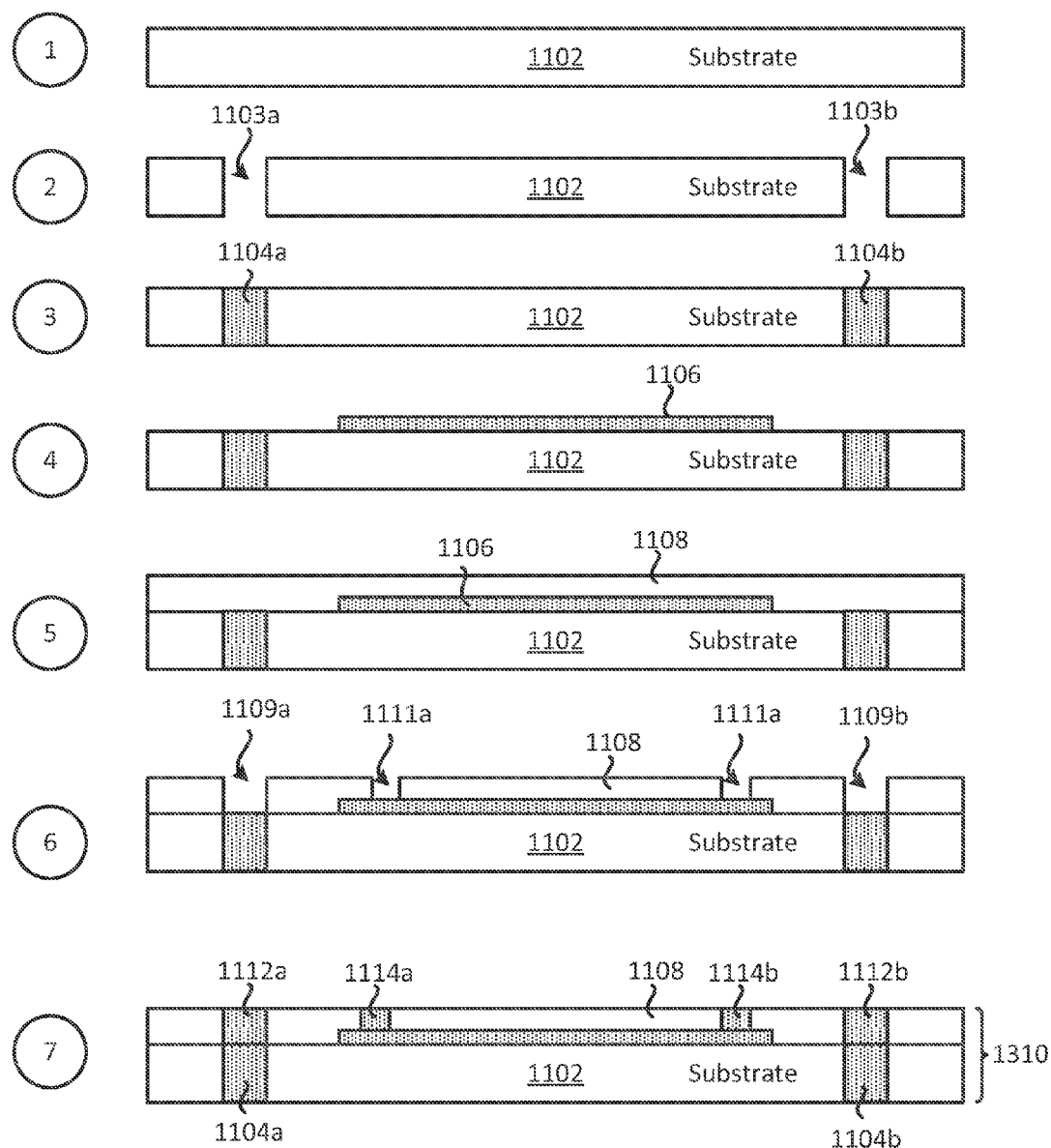
FIG. 11 illustrates an exemplary sequence for providing/fabricating a high density interconnect bridge with through substrate vias (TSVs).

In some implementations, providing/fabricating a high density interconnect bridge with through substrate vias, includes several processes. FIG. 11 illustrates an exemplary sequence for providing/fabricating a high density interconnect bridge that includes TSVs. In some implementations, the sequence of FIG. 11 may be used to provide/fabricate the bridge of FIGS. 2-10 and/or other bridges described in the present disclosure. However, for the purpose of simplification, FIG. 11 will be described in the context of providing/fabricating the bridge of FIG. 4.

It should be noted that the sequence of FIG. 11 may combine one or more stages in order to simplify and/or clarify the sequence for providing/fabricating a bridge. In some implementations, the order of the processes may be changed or modified.

Stage 1 of FIG. 11, illustrates a state after a substrate 1102 is provided. In some implementations, the substrate 1102 is provided by a supplier. In some implementations, the substrate 1102 is fabricated (e.g., formed). In some implementations, the substrate 1102 comprises a silicon substrate, a glass substrate, a ceramic substrate, and/or wafer (e.g., silicon wafer).

Stage 2 illustrates a state after cavities 1103 (e.g., cavity 1103a, cavity 1103b) are formed in the substrate 1102. Different implementations may form the cavities 1103 differently. In some implementations, a laser and/or a lithography process is used to form the cavities 1103.

Stage 3 illustrates a state after vias 1104 (e.g., via 1104a, via 1104b) are formed in the cavities of the substrate 1102. The vias 1104 may be through substrate vias (TSVs). Different implementations may form the vias 1104 differently. For example, a plating process and/or a pasting process may be use to form the vias 1104.

Stage 4 illustrates a state after a metal layer 1106 is formed on the substrate 1102. In some implementations, the metal layer 1106 may form and/or define one or more high density interconnects (e.g., as described in FIGS. 4-5). These high density interconnects may be high density electrical paths between dies. In some implementations, providing the metal layer 1106 includes forming (e.g., plating) one or more metal layers (e.g., seed layer and metal layer) and selectively etching portions of the one or more metal layers. FIGS. 15-18 illustrate examples of forming one or more metal layers using several plating processes.

Stage 5 illustrates a state after a dielectric layer 1108 is formed over the substrate 1102 and the metal layer 1106. Different implementations may use different materials for the dielectric layer 1108.

Stage 6 illustrates a state after the cavities 1109 (e.g., cavity 1109a, cavity 1109b) and the cavities 1111 (e.g., cavity 1111a, cavity 1111b) are formed in the dielectric layer 1108. Different implementations may use different processes for forming cavities in the dielectric layer 1108. In some implementations, a laser may be used to form the cavities. In some implementations, a photo etching process is used to form the cavities.

Stage 7 illustrates a state after the vias 1112 (e.g., via 1112a, via 1112b) and the vias 1114 (e.g., via 1114a, via 1114b) are formed in the dielectric layer 1108. Specifically, the vias 1112 are formed in the cavities 1109 of the dielectric layer 1108, and the vias 1114 are formed in the cavities 1111 of the dielectric layer 1108. In some implementations, the vias 1112 and the vias 1104 in combination form a through substrate vias (TSVs) that vertically traverses the entire bridge 1130. The combination of the via 1104a and via 1112a may provide an electrical path for power signal or ground reference signal to a die. In some implementations, the vias 1112 are metal layer(s) that are formed using one or more plating processes. The vias 1114 are coupled to the metal layer 1106. FIGS. 15-18 illustrate examples of forming one or more metal layers using several plating processes. In some implementations, stage 7 illustrates a bridge 1130 (e.g., silicon bridge) that may be implemented in an encapsulation layer of any of the base described in the present disclosure. It is noted that in some implementations, the vias 1104 and/or 1112 may be formed once the bridge is positioned or embedded in an encapsulation layer of the base.

Exemplary Flow Diagram of a Method for Providing/Fabricating a High Density Interconnect Bridge that Includes Through Substrate Vias (TSVs)

Figure 12:
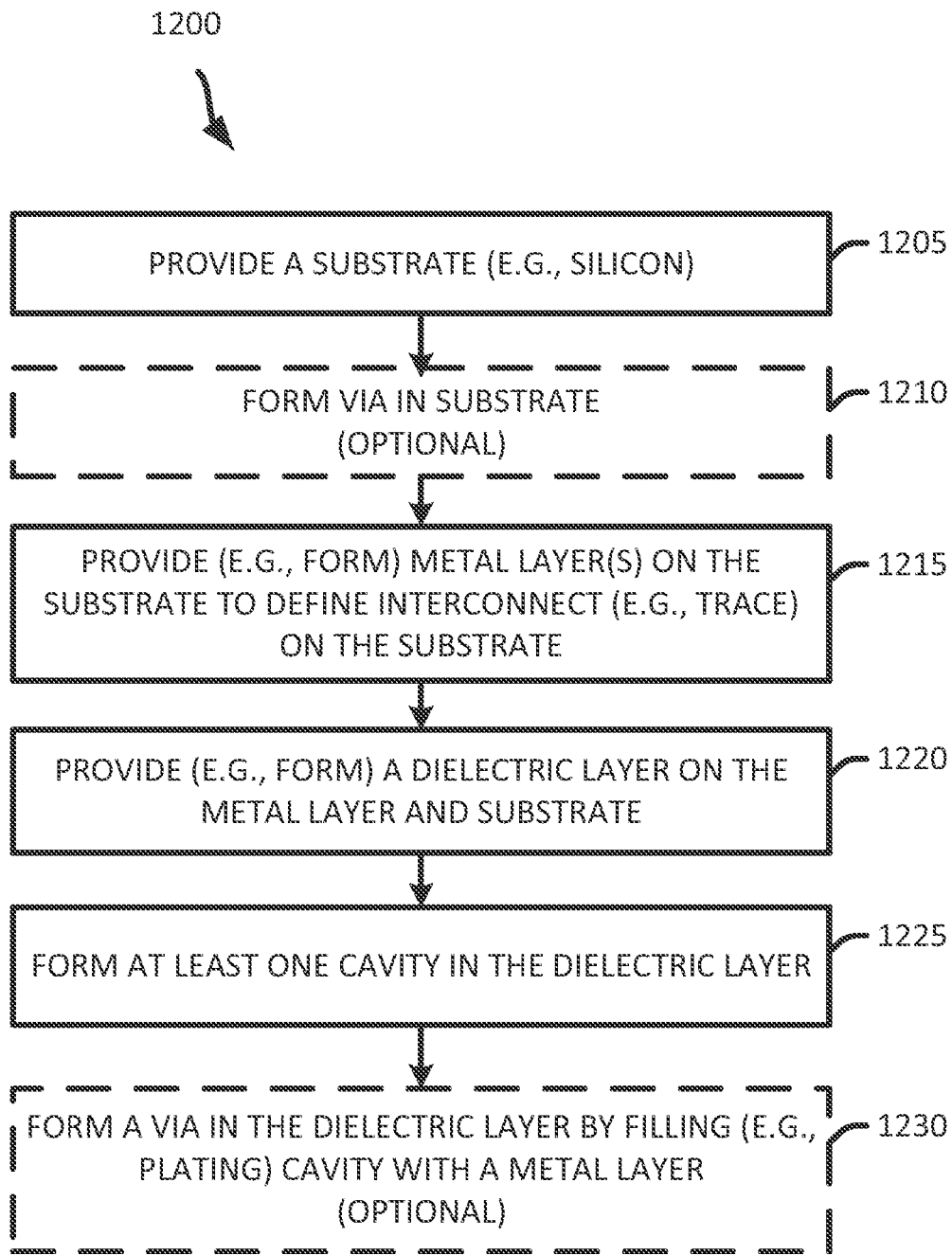
FIG. 12 illustrates an exemplary flow diagram of a method for providing/fabricating a high density interconnect bridge with through substrate vias (TSVs).

FIG. 12 illustrates an exemplary flow diagram of a method 1200 for providing/fabricating a high density interconnect silicon bridge. In some implementations, the method of FIG. 12 may be used to provide/fabricate the high density interconnect silicon bridge of FIGS. 2-10 and/or other high density interconnect silicon bridge in the present disclosure.

It should be noted that the flow diagram of FIG. 12 may combine one or more processes in order to simplify and/or clarify the method for providing a passive device package. In some implementations, the order of the processes may be changed or modified.

The method provides (at 1205) a substrate. In some implementations, providing the substrate may include receiving a substrate from a supplier or fabricating (e.g., forming) a substrate. In some implementations, the substrate comprises a silicon substrate, a glass substrate, a ceramic substrate and/or wafer (e.g., silicon wafer).

The method forms (at 1210) a through substrate via (TSV) in the substrate. In some implementations, forming a TSV includes forming a cavity in the substrate and filling the cavity with an electrically conductive material to define the TSV. In some implementations, a laser may be used to form the cavities. In some implementations, a photo etching process is used to form the cavities. A plating process or screen printing process may be used to form the vias. In some implementations, the TSV is configured to provide an electrical path for a power signal or a ground reference signal.

The method forms (at 1215) a metal layer on the substrate to form one or more high density interconnect (e.g., as described in FIGS. 4-5). In some implementations, forming the metal layer includes forming (e.g., plating) one or more metal layers (e.g., seed layer and metal layer) and selectively etching portions of the one or more metal layers. FIGS. 15-18 illustrate examples of providing one or more metal layers using several plating processes.

The method forms (at 1220) a dielectric layer over the substrate and the metal layer. Different implementations may use different materials for the dielectric layer.

The method then forms (at 1225) at least one cavity in the dielectric layer. Different implementations may use different processes for forming cavities in the dielectric layer. In some implementations, a laser may be used to form the cavities. In some implementations, a photo etching process is used to form the cavities.

The method optionally forms (at 1230) a via in the dielectric layer. Specifically, the method fills the cavity of the dielectric layer with one or more conducting material (e.g., metal layers) to form a via in the cavity. One or more of the vias may be formed over the TSVs in the substrate. In some implementations, the vias are high density vias (e.g., as described in FIGS. 4-5). In some implementations, the vias are metal layer(s) that are formed using one or more plating processes. FIGS. 15-18 illustrate examples of providing one or more metal layers using several plating processes. It should be noted that in some implementations, the vias may be formed once the bridge is positioned or embedded in a photo patternable layer of the base portion.

Exemplary Sequence for Providing/Fabricating an Integrated Device Package that Includes a High Density Interconnect Bridge that Includes Through Substrate Vias (TSVs)

Figure 13A:
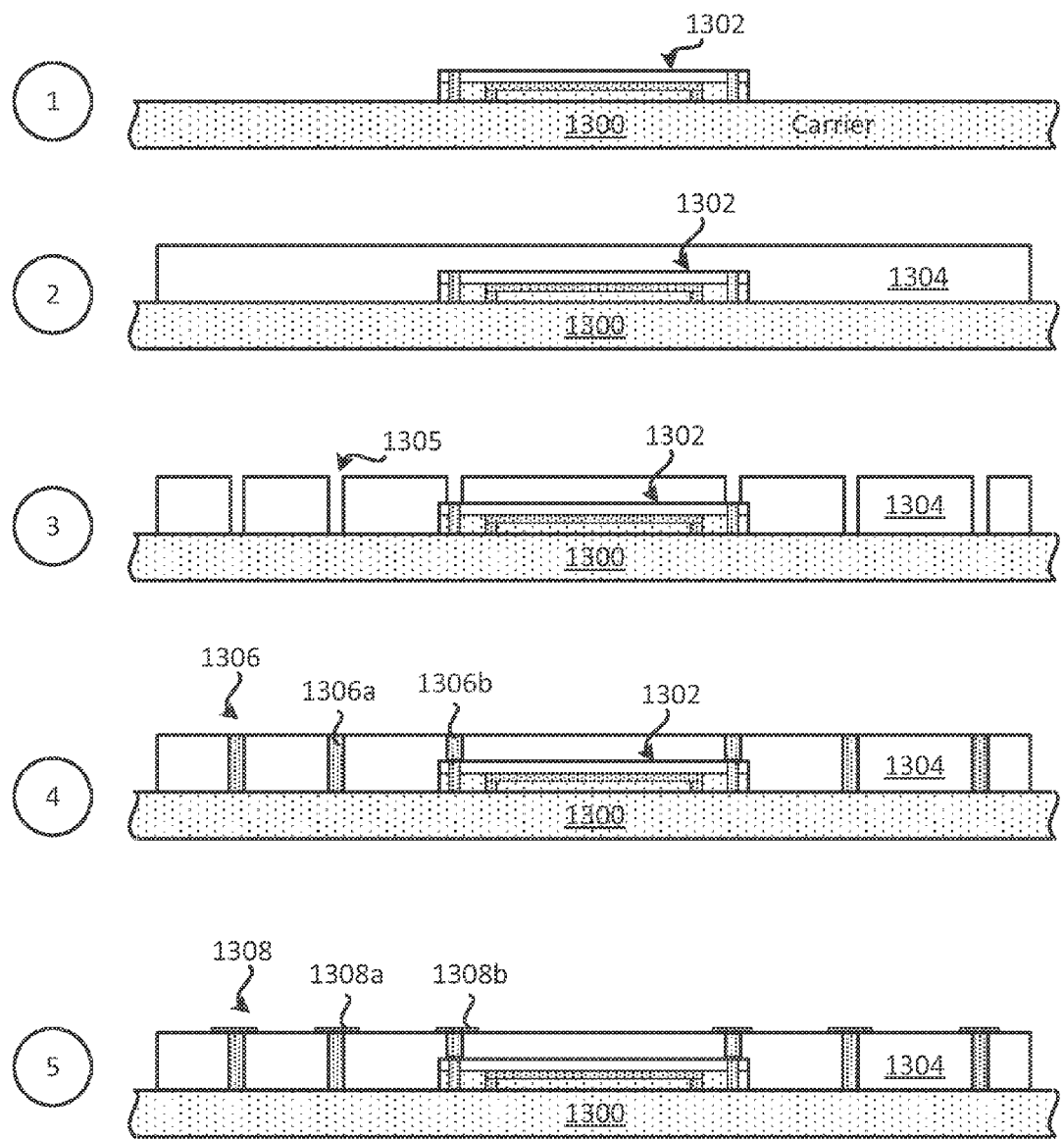
FIG. 13 (comprising FIGS. 13A-13C) illustrates an exemplary sequence for providing/fabricating an integrated device package comprising a high density bridge, with through substrate vias (TSVs), in an encapsulation layer.
Figure 13B:
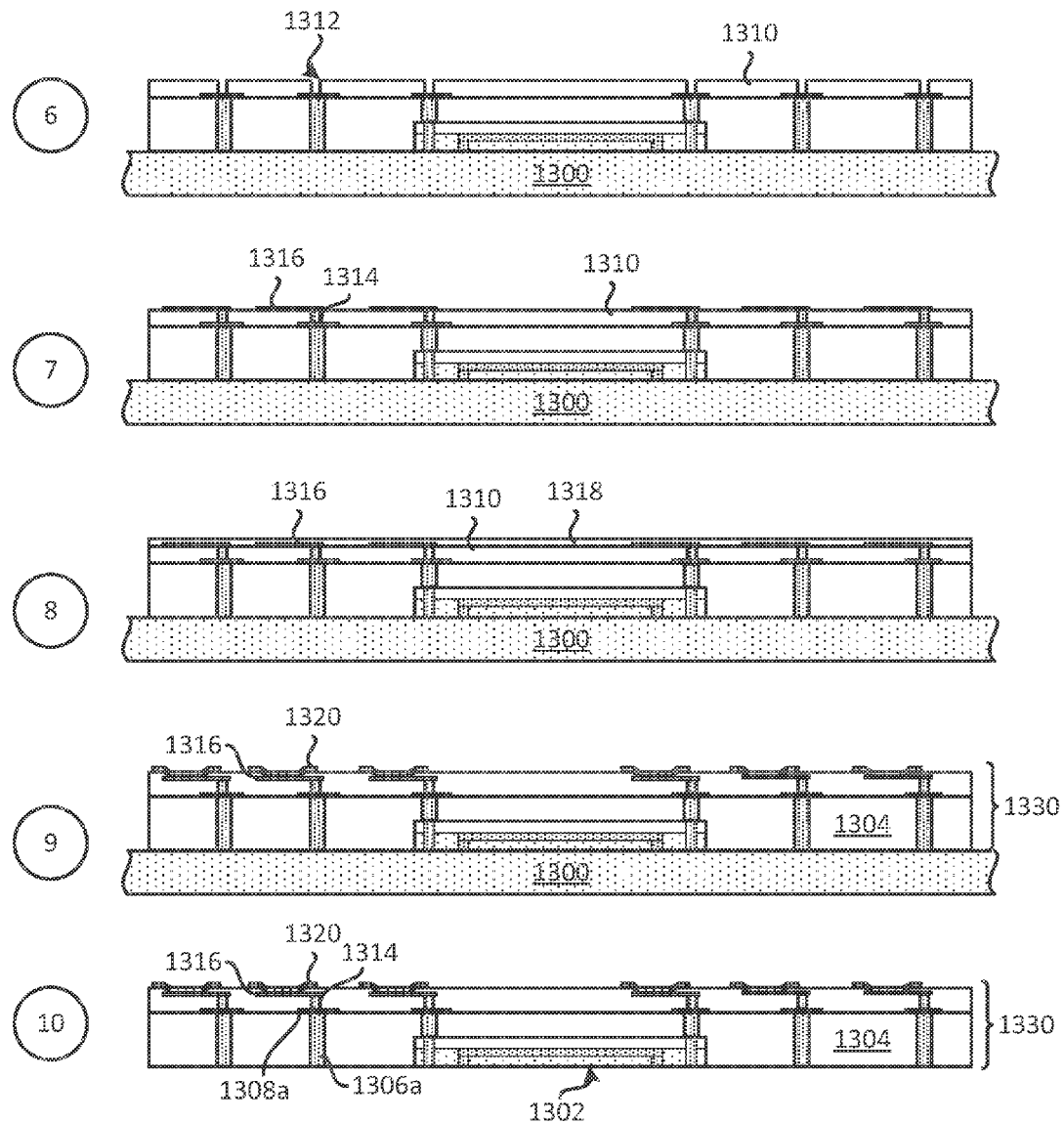
Figure 13C:
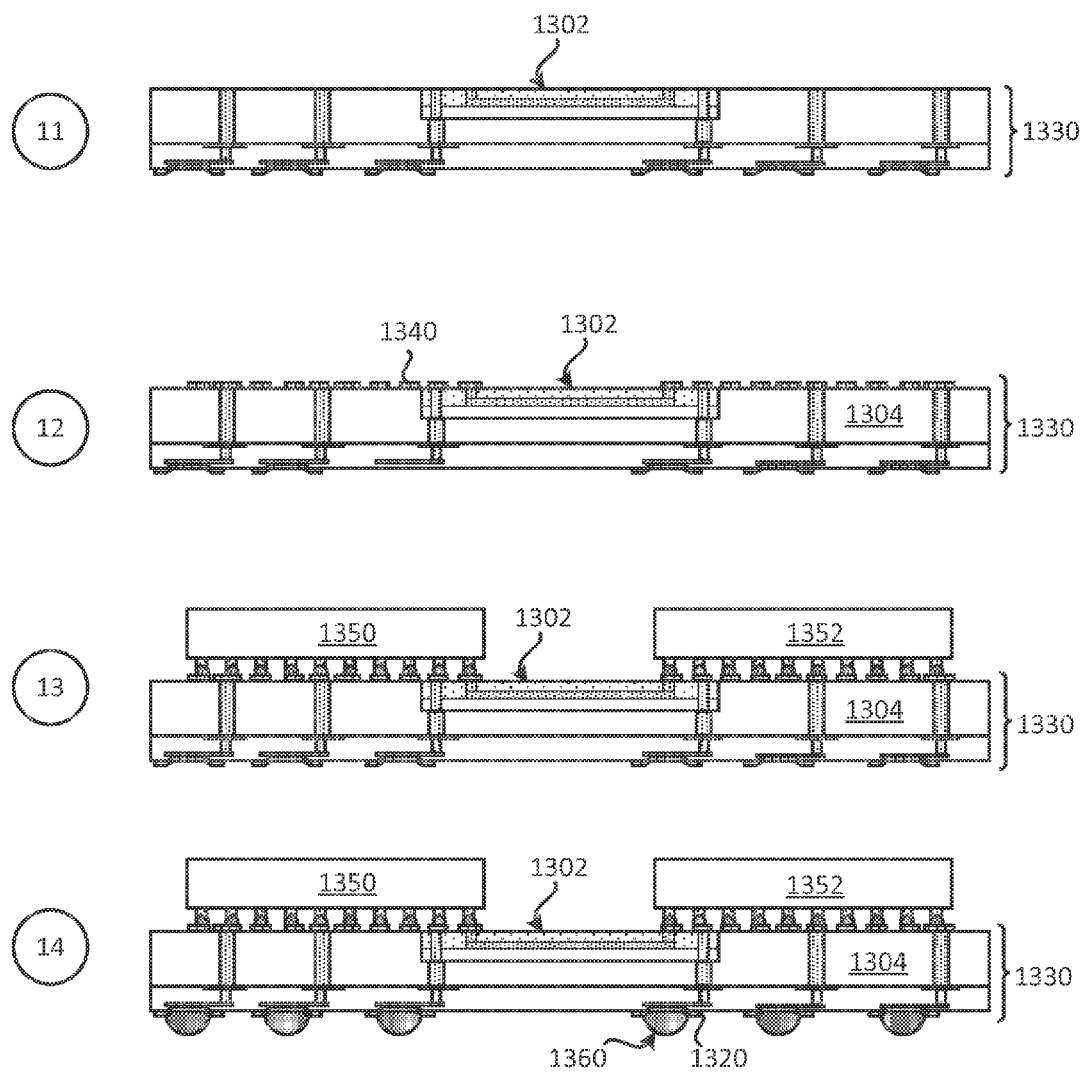

In some implementations, providing/fabricating an integrated device package that includes a high density interconnect bridge that includes a through substrate via, in an encapsulation layer includes several processes. FIG. 13 (which includes FIGS. 13A-13C) illustrates an exemplary sequence for providing/fabricating an integrated device package that includes a high density interconnect bridge that includes a through substrate via, in an encapsulation layer. In some implementations, the sequence of FIGS. 13A-13C may be used to provide/fabricate the integrated device package of FIGS. 2-3, 6-10 and/or other integrated device packages in the present disclosure. However, for the purpose of simplification, FIGS. 13A-13C will be described in the context of fabricating the integrated device package of FIG. 3.

It should be noted that the sequence of FIGS. 13A-13C may combine one or more stages in order to simplify and/or clarify the sequence for providing an integrated device package. In some implementations, the order of the processes may be changed or modified.

Stage 1 of FIG. 13A, illustrates a state after a bridge 1302 is provided (e.g., mounted) on a carrier 1300. In some implementations, the carrier 1300 is provided by a supplier. In some implementations, the carrier 1300 is fabricated (e.g., formed). In some implementations, the carrier 1300 comprises a silicon substrate and/or wafer (e.g., silicon wafer). The bridge 1302 may include a substrate, at least one metal layer, at least one via, at least one dielectric layer, and/or at least one through substrate via (TSV), as described in at least FIGS. 2-3. Examples of the bridge 1302 include the bridge shown and described in FIGS. 4-5. In some implementations, the bridge 1302 is a high density interconnect bridge configured to provide a connection and/or electrical path for signals between two dies, and to provide a connection and/or electrical path to and from a die for a power signal and/or a ground reference signal. As shown at stage 1, the bridge 1302 is coupled to a surface of the carrier 1300. In some implementations, an adhesive is used to mechanically couple the bridge 1302 to the carrier 1300.

Stage 2 illustrates a state after an encapsulation layer 1304 is provided (e.g., formed) on the carrier 1300 and the bridge 1302. The encapsulation layer 1304 may be a litho-etchable dielectric layer (e.g., etchable by using a photo etching process). The encapsulation layer 1304 at least partially encapsulates or at least partially covers the bridge 1302. The encapsulation layer 1304 may comprise a mold and/or an epoxy fill.

Stage 3 illustrates a state after at least one cavity 1305 is formed in the encapsulation layer 1304. The at least one cavity 1305 is removed by using a photo etching process that selectively removes portions of the encapsulation layer 1304 by selectively exposing the encapsulation layer 1304 to a light source (e.g., UV light).

Stage 4 illustrates a state after at least one via 1306 (e.g., via 1306a, via 1306b) is formed in the encapsulation layer 1304. Specifically, the via 1306b and the via 1306b are formed in the cavities of the encapsulation layer 1304. The via 1306a traverses the encapsulation layer 1304. The via 1306b is formed in the encapsulation layer 1304 to couple to the bridge 1302. In some implementations, the via 1306 is metal layer(s) that are formed using one or more plating processes. FIGS. 15-18 illustrate examples of forming one or more metal layers using several plating processes.

Stage 5 illustrates a state after a first metal layer 1308 is formed on a first surface of the encapsulation layer 1304 and/or vias 1306. The first metal layer 1308 may be configured to define one or more pads (e.g., pad 1308a, pad 1308b) and/or traces on the encapsulation layer 1304. The pad 1308a is formed over the via 1306a. The pad 1308b is formed over the via 1306b. In some implementations, providing the first metal layer 1308 includes forming (e.g., plating) one or more metal layers (e.g., seed layer and metal layer) and selectively etching portions of the one or more metal layers. FIGS. 15-18 illustrate examples of providing one or more metal layers using several plating processes.

In some implementations, the via 1306 and the first metal layer 1308 may be formed at the same time. Also, in some implementations, the via 1306 is a conform via that is formed along the walls of the cavity as described in FIGS. 8-9. The via 1306 (e.g., via 1306a, via 1306b) may have a profile cross section that includes a V shape or a U shape.

Stage 6, as shown in FIG. 13B, illustrates a state after a first dielectric layer 1310 is provided (e.g., formed) on the encapsulation layer 1304 and the first metal layer 1308, and after a cavity 1312 is formed in the first dielectric layer 1310. The cavity 1312 may be formed through a photo etching process.

Stage 7 illustrates a state after at least one via 1314 is formed in the first dielectric layer 1310 and a metal layer 1316 is formed on the first dielectric layer 1310. In some implementations, the via 1314 and the metal layer 1316 are formed by forming (e.g., plating) one or more metal layers (e.g., seed layer and metal layer) and selectively etching portions of the one or more metal layers. FIGS. 15-18 illustrate examples of providing one or more metal layers using several plating processes. The metal layer 1316 may be an interconnect in a redistribution portion.

Stage 8 illustrates a state after a second dielectric layer 1318 is provided (e.g., formed) on the first dielectric layer 1310 and the metal layer 1316.

Stage 9 illustrates a state after an under bump metallization (UBM) layer 1320 is formed on the second dielectric layer 1318. The UBM layer 1320 is formed such that the UBM layer 1320 is coupled to the metal layer 1316. In some implementations, providing the UBM layer 1320 includes forming (e.g., plating) one or more metal layers (e.g., seed layer and metal layer) and selectively etching portions of the one or more metal layers. FIGS. 15-18 illustrate examples of forming one or more metal layers using several plating processes.

Stage 10 illustrates a state after the carrier 1300 is decoupled from base 1330, which includes the bridge 1302, the encapsulation layer 1304, the via 1306, the metal layer 1308, the dielectric layer 1310, the via 1314, the metal layer 1316, the dielectric layer 1318, and the UBM layer 1320.

Stage 11, as shown in FIG. 13C, illustrates a state after the base 1330 is optionally flipped.

Stage 12 illustrates a state after a metal layer 1340 is formed on the encapsulation layer 1304 and the bridge 1302. The metal layer 1340 may form one or more pads and/or traces. Some portions of the metal layer 1340 may be coupled to vias in the encapsulation layer 1304 and vias in the bridge 1302. In some implementations, providing the metal layer 1340 includes forming (e.g., plating) one or more metal layers (e.g., seed layer and metal layer) and selectively etching portions of the one or more metal layers. FIGS. 15-18 illustrate examples of providing one or more metal layers using several plating processes. Although not shown, a solder resist layer may be formed over some of the metal layer 1340.

Stage 13 illustrates a state after a first die 1350 and a second die 1352 are provided (e.g., coupled, mounted) on the base 1330. Specifically, the first die 1350 is coupled to portions of the metal layer 1340 through a set of interconnects that may include at least a pillar and/or solder. The second die 1352 is coupled to other portions of metal layer 1340 through another set of interconnects that may include at least a pillar and/or solder. In some implementation, a fill (not shown) may be formed between the dies 1350-1352 and the base 1330. The fill may include a non-conducting fill (NCF) and/or a non-conducting paste (NCP).

Stage 14 illustrates a state after solder ball 1360 are provided on the UBM layer 1320.

Exemplary Method for Providing/Fabricating an Integrated Device Package that Includes a High Density Interconnect Bridge that Includes Through Substrate Vias (TSVs)

Figure 14:
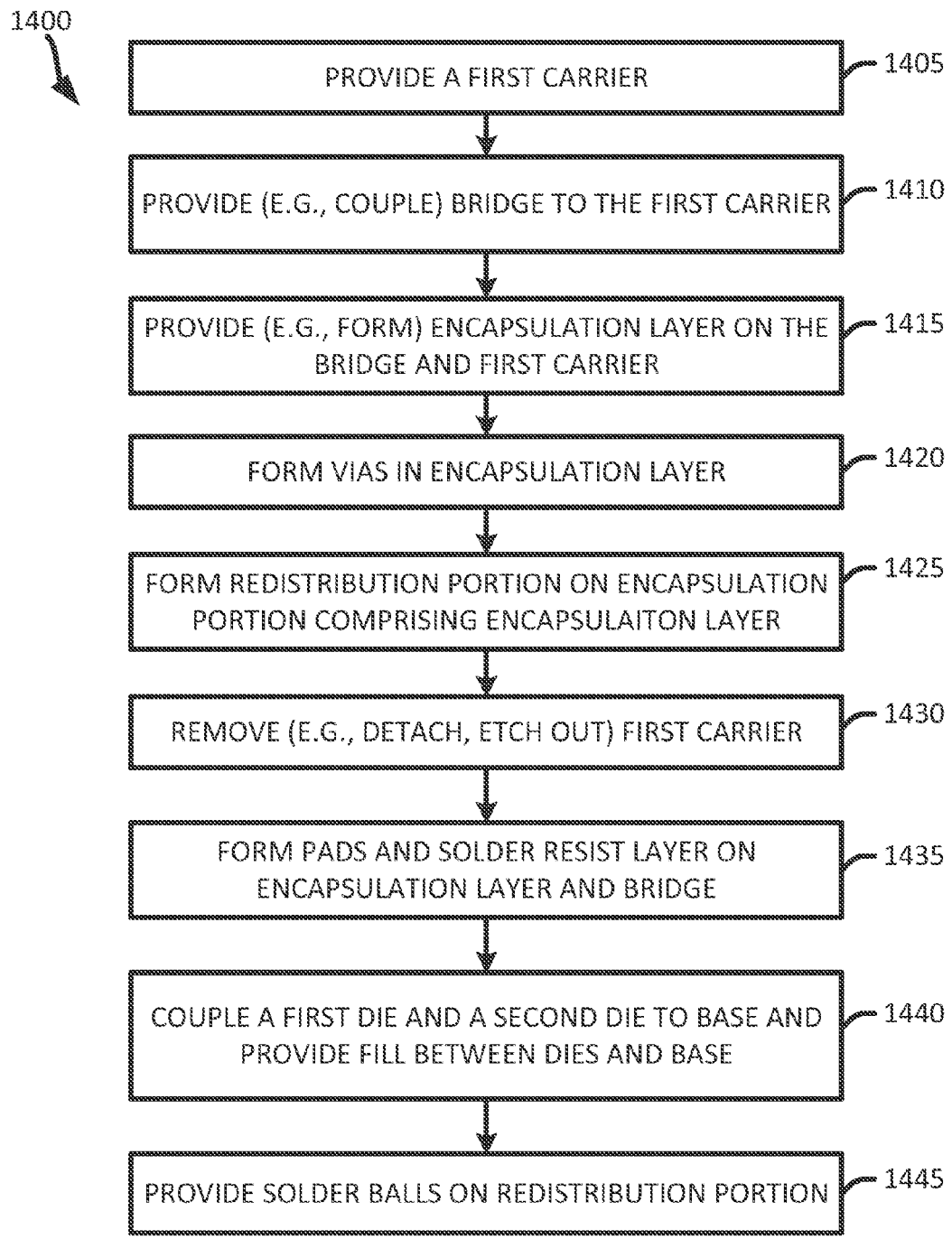
FIG. 14 illustrates an exemplary flow diagram of a method for providing/fabricating an integrated device package comprising a high density bridge, with through substrate vias (TSVs), in an encapsulation layer.

FIG. 14 illustrates an exemplary flow diagram of a method 1400 for providing/fabricating an integrated device package that includes a high density interconnect bridge with through substrate vias (TSVs), in an encapsulation layer. In some implementations, the method of FIG. 14 may be used to provide/fabricate the integrated device package of FIG. 2 and/or other integrated device packages in the present disclosure.

It should be noted that the flow diagram of FIG. 14 may combine one or more processes in order to simplify and/or clarify the method for providing an integrated device package. In some implementations, the order of the processes may be changed or modified.

The method provides (at 1405) a carrier. In some implementations, the carrier is provided by a supplier. In some implementations, the carrier is fabricated (e.g., formed). In some implementations, the carrier comprises a silicon substrate and/or wafer (e.g., silicon wafer).

The method then couples (at 1410) a bridge to the carrier. The bridge may include a substrate, at least one metal layer, at least one via, and/or at least one dielectric layer, as described in FIGS. 2-5. In some implementations, the bridge is a high density interconnect bridge configured to provide a connection and/or electrical path between two dies, and to provide a connection and/or electrical path to and from a die for a power signal and/or a ground reference signal. In some implementations, an adhesive is used to mechanically couple the bridge to the carrier.

The method forms (at 1415) an encapsulation layer on or over the carrier and the bridge. The encapsulation layer may be a litho-etchable dielectric layer. The encapsulation layer at least partially covers the bridge.

The method forms (at 1420) at least one via in the encapsulation layer. In some implementations, forming the via includes forming at least one cavity in the encapsulation layer by using a photo etching process that selectively removes portions of the encapsulation layer (e.g., by selectively exposing the encapsulation layer to a light source (e.g., UV light)). The method then fills the cavity with one or more metal layers. In some implementations, the via is metal layer(s) that are formed using one or more plating processes and/or a screen printing process. FIGS. 15-18 illustrate examples of forming one or more metal layers using several plating processes.

The method forms (at 1425) a redistribution portion on or over the encapsulation portion/layer. In some implementations, forming the redistribution portion includes forming at least one dielectric layer, and at least one metal layer. The one metal layer may define one or more interconnects (e.g., pads, traces, vias, posts, pillars, redistribution interconnects). In some implementations, providing the metal layer includes forming (e.g., plating) one or more metal layers (e.g., seed layer and metal layer) and selectively etching portions of the one or more metal layers. FIGS. 15-18 illustrate examples of providing one or more metal layers using several plating processes.

The method then decouples (at 1430) the carrier, leaving the base comprising the encapsulation layer, the bridge, the via, the pads, and the redistribution portion. Different implementations may decouple (e.g., remove) the carrier differently. In some implementations, the carrier is detached from the bridge and encapsulation layer. In some implementations, the carrier is etched out.

The method forms (at 1435) pads, traces and a solder resist layer on the encapsulation layer and the bridge. In some implementations, providing the pads includes forming (e.g., plating) one or more metal layers (e.g., seed layer and metal layer) and selectively etching portions of the one or more metal layers to define the pads. FIGS. 15-18 illustrate examples of providing one or more metal layers using several plating processes. The method may also provide solder balls on the pads.

The method then couples (at 1440) a first die and a second die to the pads on the encapsulation layer. In some implementations, a set of interconnects (e.g., pillar, solder) are used to couple the first and second dies to the pads on the encapsulation layer. The method may also provide a fill between the first and second dies and the encapsulation layer. The fill may include a non-conducting fill (NCF) and/or a non-conducting paste (NCP).

The method provides (at 1445) solder balls on the redistribution portion. For example, the method may provide solder balls on the UBM layers of the redistribution layer.

Exemplary Semi-Additive Patterning (SAP) Process

Various interconnects (e.g., traces, vias, pads) are described in the present disclosure. These interconnects may be formed in the base, the encapsulation layer, the encapsulation portion, the bridge, and/or the redistribution portion. In some implementations, these interconnects may include one or more metal layers. For example, in some implementations, these interconnects may include a first metal seed layer and a second metal layer. The metal layers may be provided (e.g., formed) using different plating processes. Below are detailed examples of interconnects (e.g., traces, vias, pads) with seed layers and how these interconnects may be formed using different plating processes. These plating processes are described to form interconnects in or on a dielectric layer. In some implementations, these plating processes may be used to form interconnects in or on an encapsulation layer.

Different implementations may use different processes to form and/or fabricate the metal layers (e.g., interconnects, redistribution layer, under bump metallization layer,). In some implementations, these processes include a semi-additive patterning (SAP) process and a damascene process. These various different processes are further described below.

Figure 15:
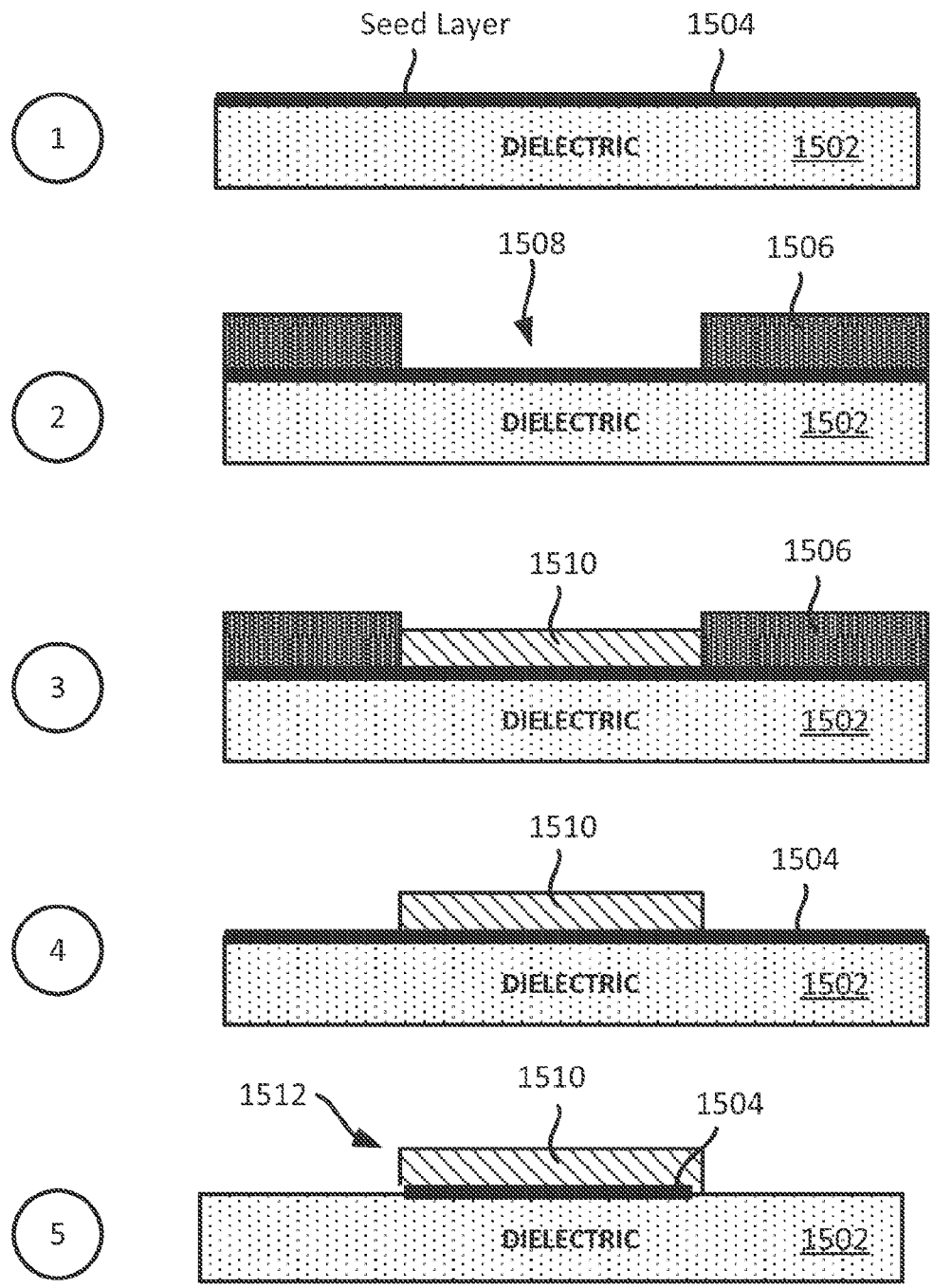
FIG. 15 illustrates an example of a semi-additive patterning (SAP) process.

FIG. 15 illustrates a sequence for forming an interconnect using a semi-additive patterning (SAP) process to provide and/or form an interconnect in one or more dielectric layer(s). As shown in FIG. 15, stage 1 illustrates a state of an integrated device (e.g., substrate) after a dielectric layer 1502 is provided (e.g., formed). In some implementations, stage 1 illustrates that the dielectric layer 1502 includes a first metal layer 1504. The first metal layer 1504 is a seed layer in some implementations. In some implementations, the first metal layer 1504 may be provided (e.g., formed) on the dielectric layer 1502 after the dielectric layer 1502 is provided (e.g., received or formed). Stage 1 illustrates that the first metal layer 1504 is provided (e.g., formed) on a first surface of the dielectric layer 1502. In some implementations, the first metal layer 1504 is provided by using a deposition process (e.g., PVD, CVD, plating process).

Stage 2 illustrates a state of the integrated device after a photo resist layer 1506 (e.g., photo develop resist layer) is selectively provided (e.g., formed) on the first metal layer 1504. In some implementations, selectively providing the photo resist layer 1506 includes providing a photo resist layer 1506 on the first metal layer 1504 and selectively removing portions of the photo resist layer 1506 by developing (e.g., using a development process). Stage 2 illustrates that the resist layer 1506 is provided such that a cavity 1508 is formed.

Stage 3 illustrates a state of the integrated device after a second metal layer 1510 is formed in the cavity 1508. In some implementations, the second metal layer 1510 is formed over an exposed portion of the first metal layer 1504. In some implementations, the second metal layer 1510 is provided by using a deposition process (e.g., plating process).

Stage 4 illustrates a state of the integrated device after the photo resist layer 1506 is removed. Different implementations may use different processes for removing the resist layer 1506.

Stage 5 illustrates a state of the integrated device after portions of the first metal layer 1504 are selectively removed. In some implementations, one or more portions of the first metal layer 1504 that is not covered by the second metal layer 1510 is removed. As shown in stage 5, the remaining first metal layer 1504 and the second metal layer 1510 may form and/or define an interconnect 1512 (e.g., trace, vias, pads) in an integrated device and/or a substrate. In some implementations, the first metal layer 1504 is removed such that a dimension (e.g., length, width) of the first metal layer 1504 underneath the second metal layer 1510 is about the same or smaller than a dimension (e.g., length, width) of the second metal layer 1510, which can result in an undercut, as shown at stage 5 of FIG. 15. In some implementations, the above mentioned processes may be iterated several times to provide and/or form several interconnects in one or more dielectric layers of an integrated device and/or substrate.

Figure 16:
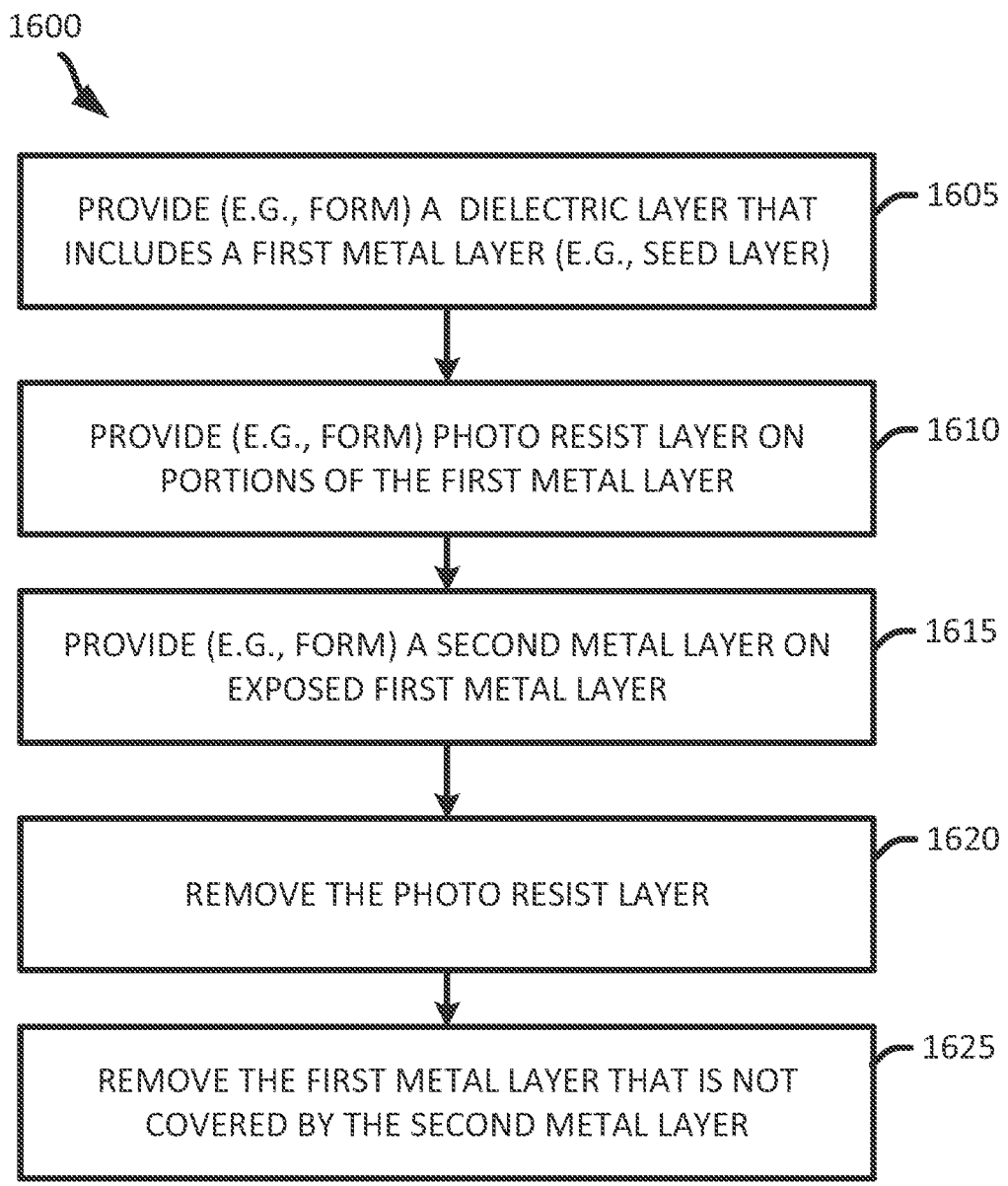
FIG. 16 illustrates an example of flow diagram of a semi-additive patterning (SAP) process.

FIG. 16 illustrates a flow diagram for a method for using a (SAP) process to provide and/or form an interconnect in one or more dielectric layer(s). The method provides (at 1605) a dielectric layer (e.g., dielectric layer 1502). In some implementations, providing the dielectric layer includes forming the dielectric layer. In some implementations, providing the dielectric layer includes forming a first metal layer (e.g., first metal layer 1504). The first metal layer is a seed layer in some implementations. In some implementations, the first metal layer may be provided (e.g., formed) on the dielectric layer after the dielectric layer is provided (e.g., received or formed). In some implementations, the first metal layer is provided by using a deposition process (e.g., physical vapor deposition (PVD) or plating process).

The method selectively provides (at 1610) a photo resist layer (e.g., a photo develop resist layer 1506) on the first metal layer. In some implementations, selectively providing the photo resist layer includes providing a photo resist layer on the first metal layer and selectively removing portions of the photo resist layer (which provides one or more cavities).

The method then provides (at 1615) a second metal layer (e.g., second metal layer 1510) in the cavity of the photo resist layer. In some implementations, the second metal layer is formed over an exposed portion of the first metal layer. In some implementations, the second metal layer is provided by using a deposition process (e.g., plating process).

The method further removes (at 1620) the photo resist layer. Different implementations may use different processes for removing the photo resist layer. The method also selectively removes (at 1625) portions of the first metal layer. In some implementations, one or more portions of the first metal layer that is not covered by the second metal layer are removed. In some implementations, any remaining first metal layer and second metal layer may form and/or define one or more interconnects (e.g., trace, vias, pads) in an integrated device and/or a substrate. In some implementations, the above mentioned method may be iterated several times to provide and/or form several interconnects in one or more dielectric layers of an integrated device and/or substrate.

Exemplary Damascene Process

Figure 17:
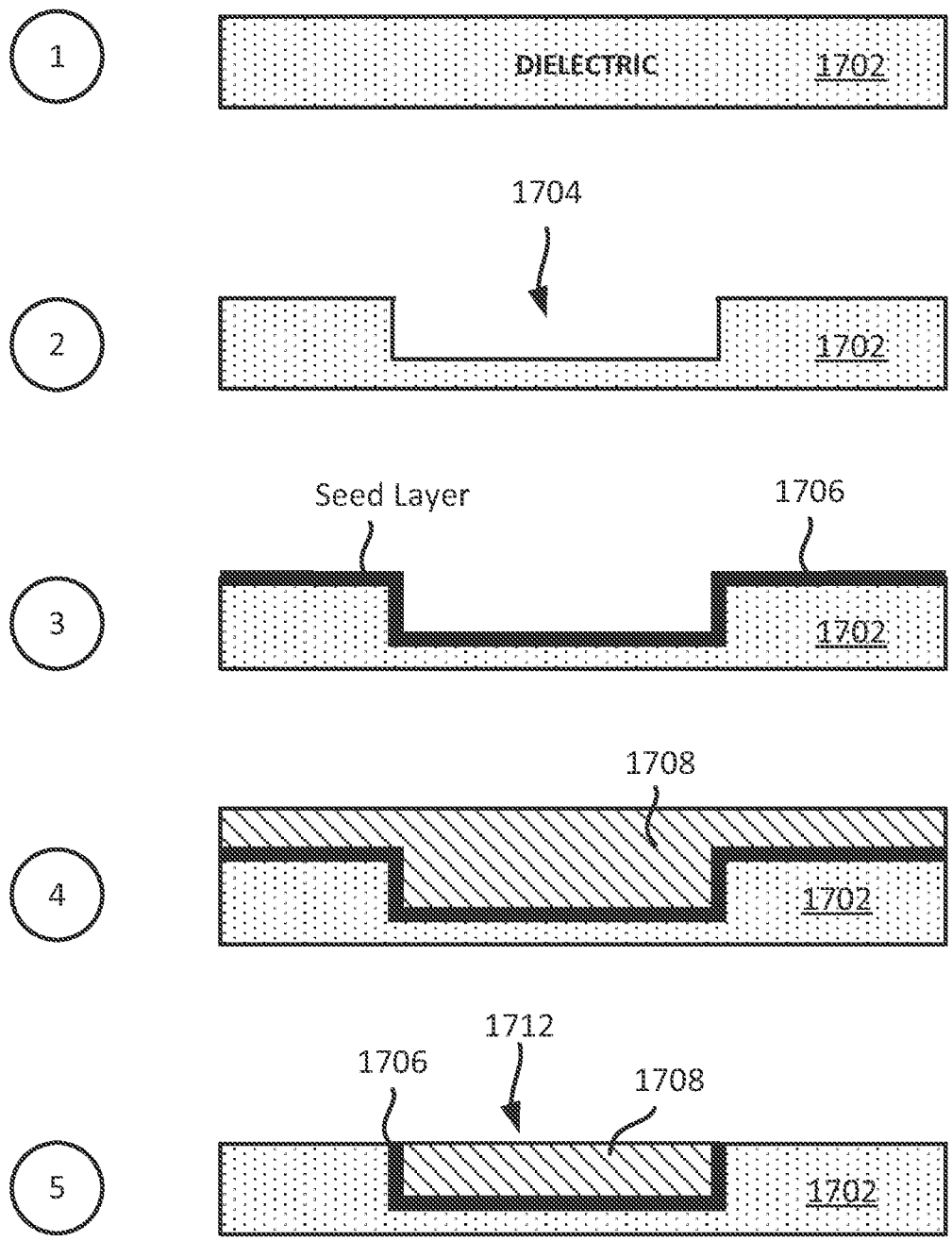
FIG. 17 illustrates an example of a damascene process.

FIG. 17 illustrates a sequence for forming an interconnect using a damascene process to provide and/or form an interconnect in a dielectric layer. As shown in FIG. 17, stage 1 illustrates a state of an integrated device after a dielectric layer 1702 is provided (e.g., formed). In some implementations, the dielectric layer 1702 is an inorganic layer (e.g., inorganic film).

Stage 2 illustrates a state of an integrated device after a cavity 1704 is formed in the dielectric layer 1702. Different implementations may use different processes for providing the cavity 1704 in the dielectric layer 1702.

Stage 3 illustrates a state of an integrated device after a first metal layer 1706 is provided on the dielectric layer 1702. As shown in stage 3, the first metal layer 1706 provided on a first surface of the dielectric layer 1702. The first metal layer 1706 is provided on the dielectric layer 1702 such that the first metal layer 1706 takes the contour of the dielectric layer 1702 including the contour of the cavity 1704. The first metal layer 1706 is a seed layer in some implementations. In some implementations, the first metal layer 1706 is provided by using a deposition process (e.g., physical vapor deposition (PVD), Chemical Vapor Deposition (CVD) or plating process).

Stage 4 illustrates a state of the integrated device after a second metal layer 1708 is formed in the cavity 1704 and a surface of the dielectric layer 1702. In some implementations, the second metal layer 1708 is formed over an exposed portion of the first metal layer 1706. In some implementations, the second metal layer 1708 is provided by using a deposition process (e.g., plating process).

Stage 5 illustrates a state of the integrated device after the portions of the second metal layer 1708 and portions of the first metal layer 1706 are removed. Different implementations may use different processes for removing the second metal layer 1708 and the first metal layer 1706. In some implementations, a chemical mechanical planarization (CMP) process is used to remove portions of the second metal layer 1708 and portions of the first metal layer 1706. As shown in stage 5, the remaining first metal layer 1706 and the second metal layer 1708 may form and/or define an interconnect 1712 (e.g., trace, vias, pads) in an integrated device and/or a substrate. As shown in stage 5, the interconnect 1712 is formed in such a way that the first metal layer 1706 is formed on the base portion and the side portion(s) of the second metal layer 1708. In some implementations, the cavity 1704 may include a combination of trenches and/or holes in two levels of dielectrics so that via and interconnects (e.g., metal traces) may be formed in a single deposition step, In some implementations, the above mentioned processes may be iterated several times to provide and/or form several interconnects in one or more dielectric layers of an integrated device and/or substrate.

Figure 18:
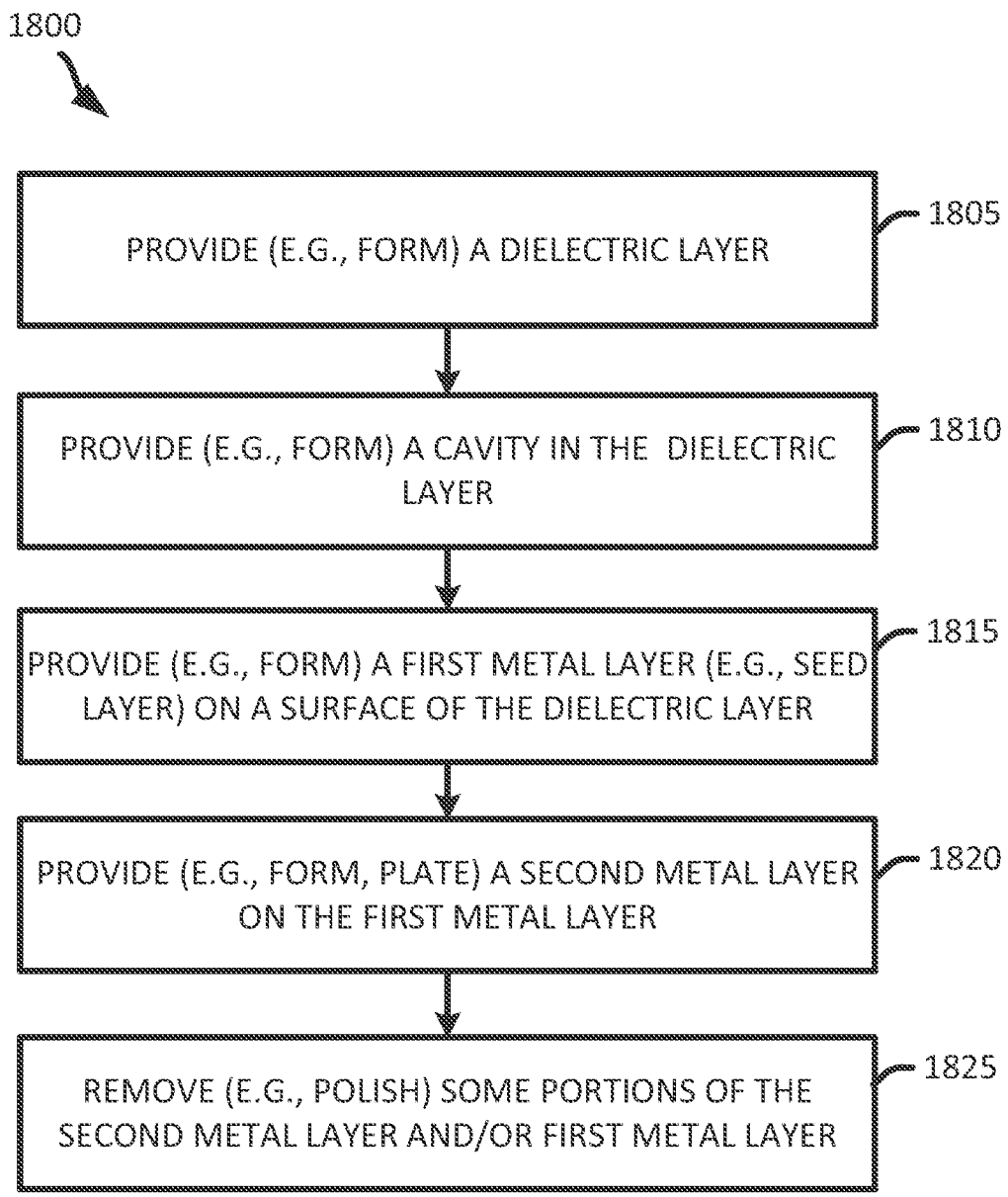
FIG. 18 illustrates an example of a flow diagram of a damascene process.

FIG. 18 illustrates a flow diagram of a method 1800 for forming an interconnect using a damascene process to provide and/or form an interconnect in a dielectric layer. The method provides (at 1805) a dielectric layer (e.g., dielectric layer 1702). In some implementations, providing a dielectric layer includes forming a dielectric layer. In some implementations, providing a dielectric layer includes receiving a dielectric layer from a supplier. In some implementations, the dielectric layer is an inorganic layer (e.g., inorganic film).

The method forms (at 1810) at least one cavity (e.g., cavity 1704) in the dielectric layer. Different implementations may use different processes for providing the cavity in the dielectric layer.

The method provides (at 1815) a first metal layer (e.g., first metal layer 1706) on the dielectric layer. In some implementations, the first metal layer is provided (e.g., formed) on a first surface of the dielectric later. In some implementations, the first metal layer is provided on the dielectric layer such that the first metal layer takes the contour of the dielectric layer including the contour of the cavity. The first metal layer is a seed layer in some implementations. In some implementations, the first metal layer 1706 is provided by using a deposition process (e.g., PVD, CVD or plating process).

The method provides (at 1820) a second metal layer (e.g., second metal layer 1708) in the cavity and a surface of the dielectric layer. In some implementations, the second metal layer is formed over an exposed portion of the first metal layer. In some implementations, the second metal layer is provided by using a deposition process (e.g., plating process). In some implementations, the second metal layer is similar or identical to the first metal layer. In some implementations, the second metal layer is different than the first metal layer.

The method then removes (at 1825) portions of the second metal layer and portions of the first metal layer. Different implementations may use different processes for removing the second metal layer and the first metal layer. In some implementations, a chemical mechanical planarization (CMP) process is used to remove portions of the second metal layer and portions of the first metal layer. In some implementations, the remaining first metal layer and the second metal layer may form and/or define an interconnect (e.g., interconnect 1712). In some implementations, an interconnect may include a trace, a via, and/or a pad) in an integrated device and/or a substrate. In some implementations, the interconnect is formed in such a way that the first metal layer is formed on the base portion and the side portion(s) of the second metal layer. In some implementations, the above mentioned method may be iterated several times to provide and/or form several interconnects in one or more dielectric layers of an integrated device and/or substrate.

Exemplary Electronic Devices

Figure 19:
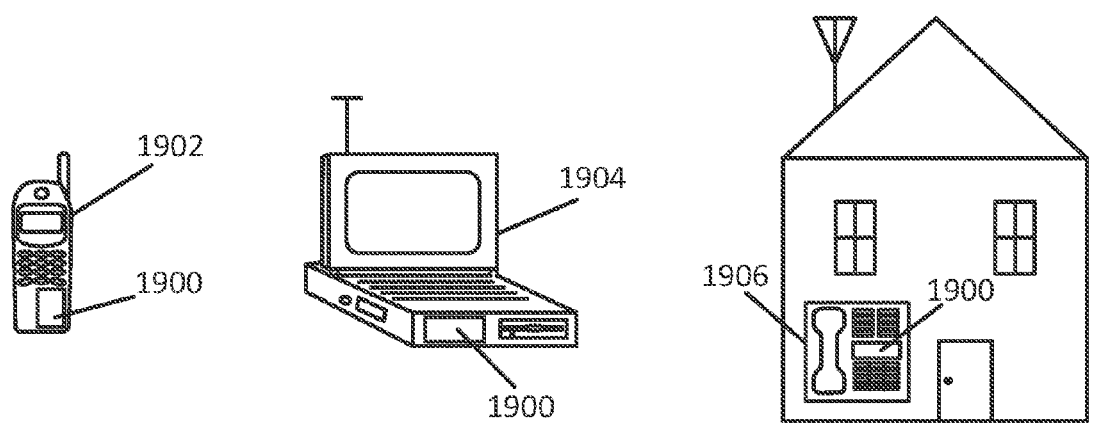
FIG. 19 illustrates various electronic devices that may integrate an integrated device package, a semiconductor device, a die, an integrated circuit and/or PCB described herein.

FIG. 19 illustrates various electronic devices that may be integrated with any of the aforementioned integrated device, semiconductor device, integrated circuit, die, interposer, package or package-on-package (PoP). For example, a mobile phone device 1902, a laptop computer device 1904, and a fixed location terminal device 1906 may include an integrated device 1900 as described herein. The integrated device 1900 may be, for example, any of the integrated circuits, dies, packages, package-on-packages described herein. The devices 1902, 1904, 1906 illustrated in FIG. 19 are merely exemplary. Other electronic devices may also feature the integrated device 1900 including, but not limited to, a group of devices that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, fixed location terminals, a laptop computer, mobile phones, or any other device that stores or retrieves data or computer instructions, or any combination thereof.

One or more of the components, features, and/or functions illustrated in FIGS. 2, 3, 4, 5, 6, 7, 8, 9, 10, 11, 12, 13A-13C, 14, 15, 16, 17, 18 and/or 19 may be rearranged and/or combined into a single component, step, feature or function or embodied in several components, steps, or functions. Additional elements, components, steps, and/or functions may also be added without departing from the disclosure. It should also be noted that FIGS. 2, 3, 4, 5, 6, 7, 8, 9, 10, 11, 12, 13A-13C, 14, 15, 16, 17, 18 and/or 19 and its corresponding description in the present disclosure is not limited to dies and/or ICs. In some implementations, FIGS. 2, 3, 4, 5, 6, 7, 8, 9, 10, 11, 12, 13A-13C, 14, 15, 16, 17, 18 and/or 19 and its corresponding description may be used to manufacture, create, provide, and/or produce integrated devices. In some implementations, a device may include a die, a die package, an integrated circuit (IC), an integrated device, an integrated device package, a wafer, a semiconductor device, a package on package structure, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated device package base comprising:
    an encapsulation portion comprising:
        an encapsulation layer;
        a bridge, at least partially embedded in the encapsulation layer,
        configured to provide a first electrical path for a first signal between a first die and a second die; and
        a first via, in the encapsulation layer, coupled to the bridge, wherein the first via and the bridge are configured to provide a second electrical path for a second signal to the first die; and
    a redistribution portion coupled to the encapsulation portion, the redistribution portion comprising:
        at least one dielectric layer; and
        at least one interconnect, in the at least one dielectric layer, coupled to the first via.

2. The integrated device package base of claim 1, wherein the bridge comprises:
    a substrate;
    a dielectric layer;
    a first set of interconnects configured to provide the first electrical path for the first signal between the first die and the second die; and
    a through substrate via (TSV) traversing at least the substrate, the TSV coupled to the first via, the TSV configured to provide the second electrical path for the second signal to the first die.

3. The integrated device package base of claim 2, wherein the first set of interconnects comprises a width of about 2 microns (μm) or less, and/or a spacing of about 2 microns (μm) or less.

4. The integrated device package base of claim 2, wherein the first set of interconnects comprises:
    a set of vias; and
    a set of traces coupled to the set of vias.

5. The integrated device package base of claim 2, wherein the TSV traverses the substrate and the dielectric layer of the bridge.

6. The integrated device package base of claim 1, wherein the first via has a profile cross section comprising a V shape or a U shape.

7. The integrated device package base of claim 1, wherein the second signal is at least one a power signal and/or a ground reference signal.

8. The integrated device package base of claim 1, wherein the encapsulation layer is a litho-etchable material.

9. The integrated device package base of claim 1, wherein the encapsulation layer is at least one of a mold and/or an epoxy fill.

10. The integrated device package base of claim 1, wherein the integrated device package base is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, and a laptop computer.

11. An integrated device package base comprising:
    an encapsulation portion comprising:
        an encapsulation layer;
        means, at least partially embedded in the encapsulation layer, for providing a first electrical path for a first signal between a first die and a second die; and
        a first via, in the encapsulation layer, coupled to the means for providing the first electrical path for the first signal between the first die and the second die, wherein the first via and the means for providing the first electrical path for the first signal between the first die and the second die, are configured to provide a second electrical path for a second signal to the first die; and
    a redistribution portion coupled to the encapsulation portion, the redistribution portion comprising:
        at least one dielectric layer; and
        at least one interconnect, in the at least one dielectric layer, coupled to the first via.

12. The integrated device package base of claim 11, wherein the means for providing the first electrical path for the first signal between the first die and the second die comprises a first set of interconnects comprising a width of about 2 microns (μm) or less, and/or a spacing of about 2 microns (μm) or less.

13. The integrated device package base of claim 11, wherein the first via has a profile cross section comprising a V shape or a U shape.

14. The integrated device package base of claim 1, wherein the second signal is at least one of a power signal and/or a ground reference signal.

15. The integrated device package base of claim 11, wherein the integrated device package base is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, and a laptop computer.

16. An integrated device package comprising:
    a first die;

a second die; and a base coupled to the first die and the second die, comprising:

an encapsulation portion coupled to the first die and the second die, comprising:

an encapsulation layer;

a bridge, at least partially embedded in the encapsulation layer, configured to provide a first electrical path for a first signal between the first die and the second die; and a first via, in the encapsulation layer, coupled to the bridge, wherein the first via and the bridge are configured to provide a second electrical path for a second signal to the first die; and a redistribution portion coupled to the encapsulation portion, the redistribution portion comprising:

at least one dielectric layer; and at least one interconnect, in the at least one dielectric layer, coupled to the first via.

17. The integrated device package of claim 16, wherein the bridge comprises:

a substrate;

a dielectric layer;

a first set of interconnects configured to provide the first electrical path for the first signal between the first die and the second die; and a through substrate via (TSV) traversing at least the substrate, the TSV coupled to the first via, the TSV configured to provide the second electrical path for the second signal to the first die.

18. The integrated device package of claim 17, wherein the first set of interconnects comprises a width of about 2 microns (μm) or less, and/or a spacing of about 2 microns (μm) or less.

19. The integrated device package of claim 17, wherein the first set of interconnects comprises:

a set of vias; and a set of traces coupled to the set of vias.

20. The integrated device package of claim 17, wherein the TSV traverses the substrate and the dielectric layer of the bridge.

21. The integrated device package of claim 16, wherein the first via has a profile cross section comprising a V shape or a U shape.

22. The integrated device package of claim 16, wherein the second signal is at least one of a power signal and/or a ground reference signal.

23. The integrated device package of claim 16, wherein the encapsulation layer is a litho-etchable material.

24. The integrated device package of claim 16, wherein the encapsulation layer and the redistribution portion define a package substrate for the integrated device package.

25. The integrated device package of claim 16, wherein the integrated device package is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, and a laptop computer.

26. An integrated device package comprising:

a first die;

a second die; and a base coupled to the first die and the second die, comprising:

an encapsulation portion coupled to the first die and the second die, comprising:

an encapsulation layer;

means, at least partially embedded in the encapsulation layer, for providing a first electrical path for a first signal between the first die and the second die; and a first via, in the encapsulation layer, coupled to the means for providing the first electrical path for the first signal between the first die and the second die, wherein the first via and the means for providing the first electrical path for the first signal between the first die and the second die, are configured to provide a second electrical path for a second signal to the first die; and a redistribution portion coupled to the encapsulation portion, the redistribution portion comprising:

at least one dielectric layer; and at least one interconnect, in the at least one dielectric layer, coupled to the first via.

27. The integrated device package of claim 26, wherein the means for providing the first electrical path for the first signal between the first die and the second die, comprises a first set of interconnects comprising a width of about 2 microns (μm) or less, and/or a spacing of about 2 microns (μm) or less.

28. The integrated device package of claim 26, wherein the first via has a profile cross section comprising a V shape or a U shape.

29. The integrated device package of claim 26, wherein the second signal is at least one of a power signal and/or a ground reference signal.

30. The integrated device package of claim 26, wherein the integrated device package is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, and a laptop computer.

* * * * *